(12) United States Patent
Iwase et al.

(10) Patent No.: US 8,587,508 B2
(45) Date of Patent: Nov. 19, 2013

(54) SCANNING SIGNAL LINE DRIVE CIRCUIT, SHIFT REGISTER, AND DRIVE METHOD OF DRIVING SHIFT REGISTER

(75) Inventors: Yasuaki Iwase, Osaka (JP); Mayuko Sakamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 256 days.

(21) Appl. No.: 12/998,382

(22) PCT Filed: Aug. 5, 2009

(86) PCT No.: PCT/JP2009/063860
§ 371 (c)(1),
(2), (4) Date: Apr. 14, 2011

(87) PCT Pub. No.: WO2010/067641
PCT Pub. Date: Jun. 17, 2010

(65) Prior Publication Data
US 2011/0199354 A1    Aug. 18, 2011

(30) Foreign Application Priority Data

Dec. 10, 2008  (JP) ................................. 2008-314501

(51) Int. Cl.
*G09G 3/36* (2006.01)
(52) U.S. Cl.
USPC ................. 345/100; 377/64; 377/68; 377/78; 377/79; 345/99
(58) Field of Classification Search
USPC ....................................... 345/100; 377/64–81
See application file for complete search history.

(56) References Cited

U.S. PATENT DOCUMENTS

| | | | |
|---|---|---|---|
| 5,410,583 A | | 4/1995 | Weisbrod et al. |
| 5,517,542 A | * | 5/1996 | Huq ................................ 377/78 |

(Continued)

FOREIGN PATENT DOCUMENTS

| | | |
|---|---|---|
| JP | 2006-351165 A | 12/2006 |
| JP | 2006-351171 A | 12/2006 |

(Continued)

OTHER PUBLICATIONS

Extended European Search Report dated Jul. 11, 2012.

*Primary Examiner* — Alexander Eisen
*Assistant Examiner* — Sanjiv D Patel
(74) *Attorney, Agent, or Firm* — Harness, Dickey & Pierce, P.L.C.

(57) ABSTRACT

There is realized a scanning signal line drive circuit (in a display device) capable of, even in a case where a circuit in a shift register is formed using a thin-film transistor which is relatively large in off leakage, suppressing unnecessary power consumption due to a leakage current in the thin-film transistor. In at least one embodiment, bistable circuit that forms the shift register includes a thin-film transistor for raising a potential of an output terminal based on a first clock, a region netA connected to a gate terminal of the thin-film transistor, another thin-film transistor for lowering a potential of the region netA, and a region netB connected to a gate terminal of the other thin-film transistor. With this configuration, the potential of the region netB is raised based on a third clock which is advanced in phase by 90 degrees with respect to the first clock and is lowered based on a fourth clock which is delayed in phase by 90 degrees with respect to the first clock.

15 Claims, 15 Drawing Sheets

(56) References Cited

U.S. PATENT DOCUMENTS

| | | | |
|---|---|---|---|
| 5,701,136 A * | 12/1997 | Huq et al. | 345/100 |
| 6,295,046 B1 * | 9/2001 | Hebiguchi | 345/100 |
| 6,426,743 B1 * | 7/2002 | Yeo et al. | 345/213 |
| 6,504,522 B2 * | 1/2003 | Shiraki et al. | 345/98 |
| 6,621,886 B2 * | 9/2003 | Kawahata | 377/1 |
| 6,891,916 B2 * | 5/2005 | Park et al. | 377/68 |
| 7,106,292 B2 | 9/2006 | Moon | |
| 7,283,603 B1 * | 10/2007 | Chien et al. | 377/64 |
| 7,333,586 B2 * | 2/2008 | Jang | 377/64 |
| 7,639,226 B2 * | 12/2009 | Kim et al. | 345/100 |
| 8,279,210 B2 * | 10/2012 | Im et al. | 345/211 |
| 2006/0262074 A1 | 11/2006 | Shimoda | |
| 2006/0279511 A1 | 12/2006 | Uh et al. | |
| 2007/0070020 A1 | 3/2007 | Edo et al. | |
| 2008/0030445 A1 | 2/2008 | Choi et al. | |
| 2008/0101529 A1 * | 5/2008 | Tobita | 377/64 |
| 2008/0187089 A1 * | 8/2008 | Miyayama et al. | 377/79 |
| 2010/0026619 A1 | 2/2010 | Umezaki | |

FOREIGN PATENT DOCUMENTS

| | | |
|---|---|---|
| JP | 2007151092 A | 6/2007 |
| JP | 200795190 | 12/2007 |
| JP | 2008-040498 | 2/2008 |
| JP | 2008276849 A | 11/2008 |
| KR | 10-2008-0000850 | 1/2008 |
| KR | 10-2008-0002625 | 1/2008 |
| KR | 10-2008-0009446 | 1/2008 |
| RU | 2 116 678 | 7/1998 |

* cited by examiner

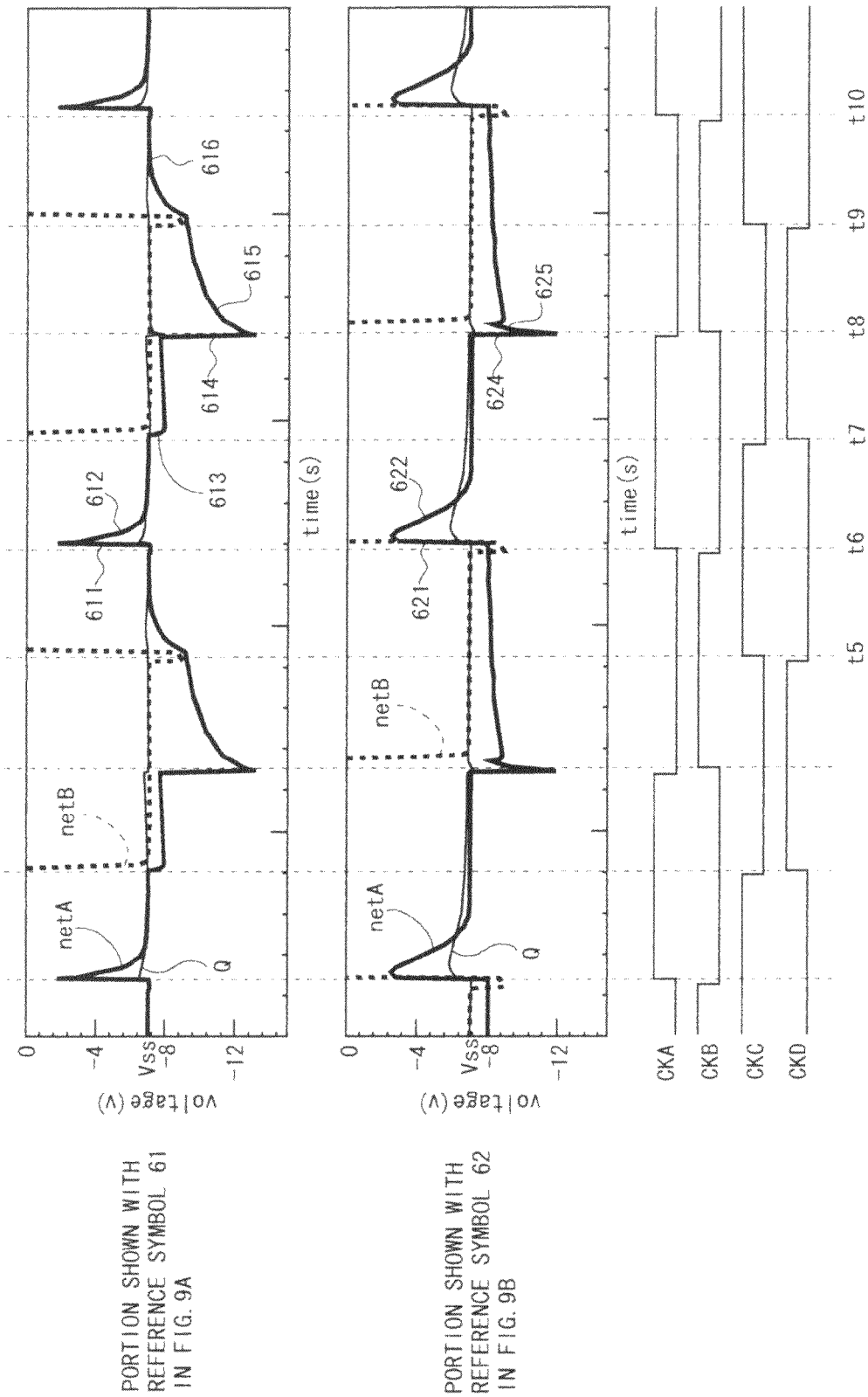

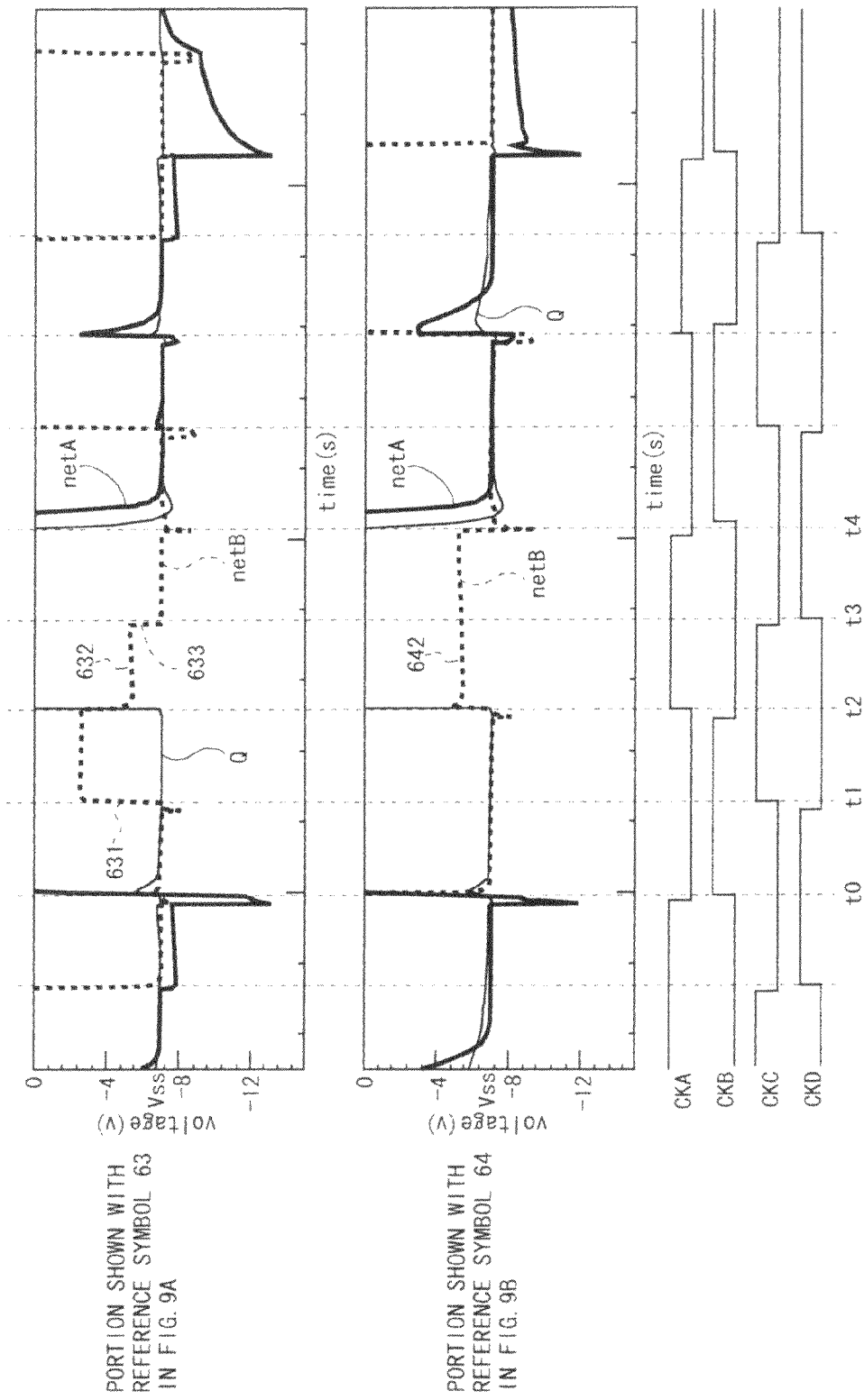

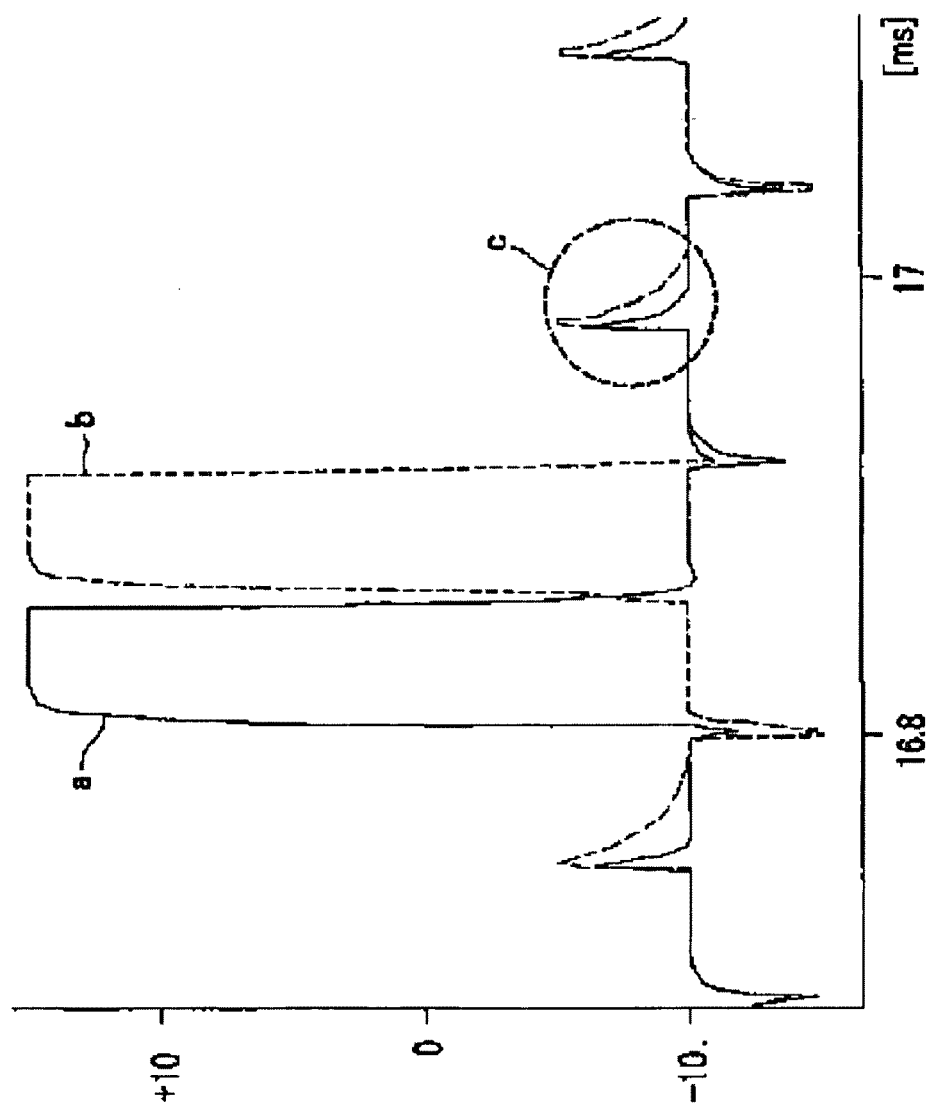

SCANNING SIGNAL LINE DRIVE CIRCUIT, SHIFT REGISTER, AND DRIVE METHOD OF DRIVING SHIFT REGISTER

TECHNICAL FIELD

The present invention relates to a drive circuit and a drive method for an active matrix-type display device. More specifically, the invention relates to a shift register in a scanning signal line drive circuit that drives scanning signal lines arranged on a display portion in an active matrix-type display device, and a drive method therefor.

BACKGROUND ART

Liquid crystal display devices utilizing amorphous silicon (a-Si) thin film transistors (hereinafter referred to as "a-Si TFTs") as driver elements have conventionally been known. In recent years, development of liquid crystal display devices utilizing microcrystalline silicon (μc-Si) thin film transistors (hereinafter referred to as "μc-Si TFTs") as driver elements is moving forward. Mobility of microcrystalline silicon is greater than that of amorphous silicon, and the μc-Si TFTs can be formed by a process similar to that of the a-Si TFTs. For this reason, employment of the μc-Si TFTs as the driver elements is expected to realize such as a cost reduction by decreasing a frame area and by decreasing a number of chips in a driver IC, an improvement of a mounting yield, and an increase in size of display devices. Further, the μc-Si TFTs have a characteristic that a threshold shift (a change in a threshold voltage) when a voltage is applied to a gate electrode for an extended period of time is smaller than that of the a-Si TFTs. In other words, the μc-Si TFTs are more reliable than the a-Si TFTs in that the μc-Si TFTs are insusceptible to degradation.

By the way, a display unit of an active matrix-type liquid crystal display device includes a plurality of source bus lines (video signal lines), a plurality of gate bus lines (scanning signal lines), and a plurality of pixel formation portions respectively provided at intersections of the plurality of source bus lines and the plurality of gate bus lines. These pixel formation portions are arranged in a matrix to constitute a pixel array. Each pixel formation portion includes such as a thin film transistor as a switching element whose gate terminal is connected to the gate bus line that passes the corresponding intersection and whose source terminal is connected to the source bus line that passes the corresponding intersection, and a pixel capacitance for storing a pixel value. Further, such an active matrix-type liquid crystal display device is provided with a source driver (video signal line drive circuit) for driving the plurality of source bus lines and a gate driver (scanning signal line drive circuit) for driving the plurality of gate bus lines.

Video signals indicating pixel values are transferred via the source bus lines. However, it is not possible to transfer video signals indicating pixel values for the plurality of lines at one time (the same time) through a single source bus line. For this reason, the video signals are written to the pixel capacitances in the pixel formation portions arranged in a matrix sequentially line by line. Therefore, the gate driver is configured by a shift register having a plurality of stages so that the plurality of gate bus lines are sequentially selected for a predetermined period.

It is desirable that each gate bus line turns to a selected state only once in one frame period (one horizontal scanning period). Therefore, it is preferable that a scanning signal to be applied to each gate bus line is to be at a potential at a High level only in a period that each gate bus line should be set to the selected state (hereinafter, referred to as a "selection period") and is fixed at a potential at a Low level in a period other than the selection period (hereinafter, referred to as a "non-selection period"). However, the potential of the scanning signal sometimes varies in a positive direction from the potential at the Low level in the non-selection period under an influence of a parasitic capacitance formed on a circuit that forms the shift register. Thus, Japanese Patent Application Laid-Open No. 2006-351171 discloses an invention concerning a shift register capable of reducing an influence due to a parasitic capacitance as compared with a conventional case. FIG. 15 is a circuit diagram showing a configuration corresponding to one stage in the shift register disclosed in Japanese Patent Application Laid-Open No. 2006-351171. According to this circuit, during a non-selection period, a gate bus line does not turn to a floating state and a gate-off voltage is always supplied to the gate bus line. It is considered that this allows suppression of the influence due to the parasitic capacitance.

PRIOR ART DOCUMENT

Patent Document

[Patent Document 1] Japanese Patent Application Laid-Open No. 2006-351171

SUMMARY OF THE INVENTION

Problems to be Solved by the Invention

With the configuration described above, however, as shown with a reference symbol "c" in FIG. 16 (FIG. 9 in Japanese Patent Application Laid-Open No. 2006-351171), in the non-selection period, a potential of a scanning signal varies in a positive direction from a potential at a Low level due to the influence of the parasitic capacitance. The following matters are considered as the reasons therefor. In Japanese Patent Application Laid-Open No. 2006-351171, attention is focused on a parasitic capacitance between the gate bus line and a common electrode. However, such a parasitic capacitance is also formed between electrodes of a thin-film transistor in the circuit that forms the shift register. For example, a parasitic capacitance is formed between a gate and a source of a thin-film transistor shown with a reference symbol T1 in FIG. 15. Hence, when a potential of a clock LCLK1 changes from the Low level to a High level, a potential of the gate terminal of the thin-film transistor T1 rises through the parasitic capacitance. As a result, a leakage current flows through the thin-film transistor T1, so that the potential of the scanning signal varies. Herein, since the clock LCLK1 is set to the state of the High level at a predetermined cycle even in the non-selection period, the potential of the scanning signal varies at the predetermined cycle.

As described above, when the potential of the scanning signal in the non-selection period varies, an unnecessary electric current flows through the gate bus line for transmitting the scanning signal. For example, in a case of a display device that adopts a WXGA panel, at each point in time, only one of 768 gate bus lines should be set to a selected state and each of the remaining 767 gate bus lines should be set to an unselected state. In other words, a scanning signal to be applied to each of the 767 gate bus lines must be fixed at the Low level. However, if the leakage current described above is generated at each stage of the shift register, unnecessary electric currents corresponding to the 767 gate bus lines flow through the entire display device. Consequently, electric power is consumed unnecessarily.

Moreover, the μc-Si TFT described above is larger than the a-Si TFT with regard to an off leakage (a leakage current generated in an Off state). Hence, in a case of adopting a μc-Si TFT for a circuit that forms a shift register, unnecessary power consumption due to a leakage current becomes large as compared with a case of adopting an a-Si TFT.

It is an object of the present invention to realize a scanning signal line drive circuit (in a display device) capable of, even in a case where a circuit in a shift register is formed using a thin-film transistor which is relatively large in off leakage, suppressing unnecessary power consumption due to a leakage current in the thin-film transistor.

Means for Solving the Problems

A first aspect of the present invention is directed to a scanning signal line drive circuit of a display device that drives a plurality of scanning signal lines arranged on a display portion, the scanning signal line drive circuit comprising:

a shift register including a plurality of bistable circuits each having a first state and a second state and connected in series to one another, the shift register setting the plurality of bistable circuits sequentially to the first state based on four-phase clock signals which are externally inputted and are supplied as first, second, third and fourth clock signals to the respective bistable circuits, the four-phase clock signals each repeating a potential at a High level and a potential at a Low level cyclically, wherein each bistable circuit includes:
an output-node charging portion including a first switching element having a second electrode supplied with the first clock signal, and a third electrode connected to an output-node which is a node for outputting a state signal indicating one of the first state and the second state and which is a node connected to the scanning signal line, the output-node charging portion setting the state indicated by the state signal to the first state;
an output-node discharging portion for setting the state indicated by the state signal to the second state;
a first-node charging portion for charging a first-node connected to a first electrode of the first switching element based on a predetermined set signal;
a first first-node discharging portion for discharging the first-node, the first first-node discharging portion including a second switching element having a second electrode connected to the first-node, and a third electrode supplied with a predetermined low potential;
a second-node charging portion for charging a second-node connected to a first electrode of the second switching element based on the third clock signal; and
a first second-node discharging portion for discharging the second-node based on the fourth clock signal, a duty ratio which is a ratio of a period, during which the potential at the High level is maintained, to a cycle, in which the potential at the High level and the potential at the Low level are repeated with regard to each of the four-phase clock signals, is set to one-half, the first clock signal and the second clock signal are shifted in phase by 180 degrees with respect to each other, the third clock signal and the fourth clock signal are shifted in phase by 180 degrees with respect to each other, and the third clock signal is advanced in phase with respect to the first clock signal.

According to a second aspect of the present invention, in the first aspect of the present invention, in each bistable circuit,
the second-node charging portion includes a third switching element having a first electrode and a second electrode each supplied with the third clock signal, and a third electrode connected to the second-node,
the first second-node discharging portion includes a fourth switching element having a first electrode supplied with the fourth clock signal, a second electrode connected to the second-node, and a third electrode supplied with a predetermined low potential, and
the first-node charging portion includes a fifth switching element having a first electrode and a third electrode each supplied with the set signal, and a second electrode connected to the first-node.

According to a third aspect of the present invention, in the first aspect of the present invention,
each bistable circuit further includes:
a second second-node discharging portion for discharging the second-node based on a charging voltage of the first-node, the second second-node discharging portion including a sixth switching element having a first electrode connected to the first-node, a second electrode connected to the second-node, and a third electrode supplied with the predetermined low potential; and
a second first-node discharging portion for discharging the first-node based on a predetermined reset signal, the second first-node discharging portion including a seventh switching element having a first electrode supplied with the reset signal, a second electrode connected to the first-node, and a third electrode supplied with a predetermined low potential.

According to a fourth aspect of the present invention, in the third aspect of the present invention,
the four-phase clock signals are configured with a first clock signal group including two-phase clock signals which are supplied as the first and second clock signals to each bistable circuit, and a second clock signal group including two-phase clock signals which are supplied as the third and fourth clock signals to each bistable circuit, and when adjacent two bistable circuits are defined as first and second bistable circuits,
the first bistable circuit is supplied with, as the first clock signal, one of the two-phase clock signals included in the first clock signal group, is supplied with, as the second clock signal, the other one of the two-phase clock signals included in the first clock signal group, is supplied with, as the third clock signal, one of the two-phase clock signals included in the second clock signal group, is supplied with, as the fourth clock signal, the other one of the two-phase clock signals included in the second clock signal group, and is supplied with, as the reset signal, the state signal outputted from the second bistable circuit, and
the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

According to a fifth aspect of the present invention, in the fourth aspect of the present invention, the signal line transmitting the first clock signal group is larger in width than the signal line transmitting the second clock signal group.

According to a sixth aspect of the present invention, in the third aspect of the present invention, the four-phase clock signals are configured with a first clock signal set and a second clock signal set each including the two-phase clock signals shifted in phase by 180 degrees with respect to each other, and when a bistable circuit previous to a certain one of the plurality of bistable circuits is defined as a first bistable circuit and a bistable circuit subsequent to the certain bistable circuit is defined as a second bistable circuit, the first bistable circuit is supplied with, as the first clock signal, one of the two-phase clock signals included in the first clock signal set, is supplied with, as the second clock signal, the other one of the two-phase clock signals included in the first clock signal set, is supplied with, as the third clock signal, one of the two-phase clock signals included in the second clock signal set, is supplied with, as the fourth clock signal, the other one of the two-phase clock signals included in the second clock signal set, and is supplied with, as the reset signal, the state signal outputted from the second bistable circuit, and the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

According to a seventh aspect of the present invention, in the first aspect of the present invention, the output-node discharging portion includes:

a first output-node discharging portion for setting the state indicated by the state signal to the second state based on the reset signal, the first output-node discharging portion including an eighth switching element having a first electrode supplied with the reset signal, a second electrode connected to the output-node, and a third electrode supplied with a predetermined low potential; and a second output-node discharging portion for setting the state indicated by the state signal to the second state based on the second clock signal, the second output-node discharging portion including a ninth switching element having a first electrode supplied with the second clock signal, a second electrode connected to the output-node, and a third electrode supplied with a predetermined low potential.

According to an eighth aspect of the present invention, in the seventh aspect of the present invention, the output-node discharging portion further includes a third output-node discharging portion for setting the state indicated by the state signal to the second state based on a charging voltage of the second-node, the third output-node discharging portion including a tenth switching element having a first electrode connected to the second-node, a second electrode connected to the output-node, and a third electrode supplied with a predetermined low potential.

According to a ninth aspect of the present invention, in the first aspect of the present invention, each bistable circuit further includes a capacitor having one end connected to the first-node, and the other end connected to the output-node.

According to a tenth aspect of the present invention, in the first aspect of the present invention, the third clock signal is advanced in phase by 90 degrees with respect to the first clock signal.

According to an eleventh aspect of the present invention, in the first aspect of the present invention, the scanning signal line drive circuit includes a first scanning signal line drive circuit for supplying the state signal from one ends to other ends of the plurality of scanning signal lines, and a second scanning signal line drive circuit for supplying the state signal from the other ends to the one ends of the plurality of scanning signal lines.

According to a twelfth aspect of the present invention, in the eleventh aspect of the present invention, the first scanning signal line drive circuit supplies the state signal to one of the plurality of scanning signal lines on odd-numbered rows and the plurality of scanning signal lines on even-numbered rows, and the second scanning signal line drive circuit supplies the state signal to the other one of the plurality of scanning signal lines on the odd-numbered rows and the plurality of scanning signal lines on the even-numbered rows.

According to a thirteenth aspect of the present invention, in the eleventh aspect of the present invention, each scanning signal line is supplied with the state signal from both the first scanning signal line drive circuit and the second scanning signal line drive circuit.

According to a fourteenth aspect of the present invention, in the first aspect of the present invention, the switching elements included in each bistable circuit are thin-film transistors made of microcrystalline silicon.

According to a fifteenth aspect of the present invention, in the first aspect of the present invention, the switching elements included in each bistable circuit are thin-film transistors made of amorphous silicon.

According to a sixteenth aspect of the present invention, in the first aspect of the present invention, at least one of the switching elements each having the second electrode connected to the first-node is a thin-film transistor having a multi-channel structure.

A seventeenth aspect of the present invention is directed to a display device comprising:

a display portion; and a scanning signal line drive circuit that drives a plurality of scanning signal lines arranged on the display portion, wherein the scanning signal line drive circuit includes a shift register including a plurality of bistable circuits each having a first state and a second state and connected in series to one another, the shift register setting the plurality of bistable circuits sequentially to the first state based on four-phase clock signals which are externally inputted and are supplied as first, second, third and fourth clock signals to the respective bistable circuits, the four-phase clock signals each repeating a potential at a High level and a potential at a Low level cyclically, each bistable circuit includes:

an output-node charging portion including a first switching element having a second electrode supplied with the first clock signal, and a third electrode connected to an output-node which is a node for outputting a state signal indicating one of the first state and the second state and which is a node connected to the scanning signal line, the output-node charging portion setting the state indicated by the state signal to the first state;

an output-node discharging portion for setting the state indicated by the state signal to the second state;

a first-node charging portion for charging a first-node connected to a first electrode of the first switching element based on a predetermined set signal;

a first first-node discharging portion for discharging the first-node, the first first-node discharging portion including a second switching element having a second electrode connected to the first-node, and a third electrode supplied with a predetermined low potential;

a second-node charging portion for charging a second-node connected to a first electrode of the second switching element based on the third clock signal; and a first second-node discharging portion for discharging the second-node based on the fourth clock signal, a duty ratio which is a ratio of a period, during which the potential at the High level is maintained, to a cycle, in which the potential at the High level and the potential at the Low level are repeated with regard to each of the four-phase clock signals, is set to one-half, the first clock signal and the second clock signal are shifted in phase by 180 degrees with respect to each other, the third clock signal and the fourth clock signal are shifted in phase by 180 degrees with respect to each other, and the third clock signal is advanced in phase with respect to the first clock signal.

According to an eighteenth aspect of the present invention, in the seventeenth aspect of the present invention, the display device is a driver monolithic type in which the display portion and the scanning signal line drive circuit are formed on a single substrate.

A nineteenth aspect of the present invention is directed to a shift register for driving a plurality of scanning signal lines arranged on a display portion in a display device, the shift register comprising a plurality of bistable circuits each having a first state and a second state and connected in series to one another, the shift register setting the plurality of bistable circuits sequentially to the first state based on four-phase clock signals which are externally inputted and are supplied as first, second, third and fourth clock signals to the respective bistable circuits, the four-phase clock signals each repeating a potential at a High level and a potential at a Low level cyclically, wherein each bistable circuit includes:

an output-node charging portion including a first switching element having a second electrode supplied with the first clock signal, and a third electrode connected to an output-node which is a node for outputting a state signal indicating one of the first state and the second state and which is a node connected to the scanning signal line, the output-node charging portion setting the state indicated by the state signal to the first state;

an output-node discharging portion for setting the state indicated by the state signal to the second state;

a first-node charging portion for charging a first-node connected to a first electrode of the first switching element based on a predetermined set signal;

a first first-node discharging portion for discharging the first-node, the first first-node discharging portion including a second switching element having a second electrode connected to the first-node, and a third electrode supplied with a predetermined low potential;

a second-node charging portion for charging a second-node connected to a first electrode of the second switching element based on the third clock signal; and a first second-node discharging portion for discharging the second-node based on the fourth clock signal, a duty ratio which is a ratio of a period, during which the potential at the High level is maintained, to a cycle, in which the potential at the High level and the potential at the Low level are repeated with regard to each of the four-phase clock signals, is set to one-half, the first clock signal and the second clock signal are shifted in phase by 180 degrees with respect to each other, the third clock signal and the fourth clock signal are shifted in phase by 180 degrees with respect to each other, and the third clock signal is advanced in phase with respect to the first clock signal.

A twentieth aspect of the present invention is directed to a drive method for a shift register for driving a plurality of scanning signal lines arranged on a display portion in a display device, the shift register including a plurality of bistable circuits each having a first state and a second state and connected in series to one another, the shift register setting the plurality of bistable circuits sequentially to the first state based on four-phase clock signals which are externally inputted and are supplied as first, second, third and fourth clock signals to the respective bistable circuits, the four-phase clock signals each repeating a potential at a High level and a potential at a Low level cyclically, the drive method comprising:

a first driving step of changing each bistable circuit from the second state to the first state, maintaining each bistable circuit at the first state during a predetermined period, and then changing each bistable circuit to the second state; and a second driving step of maintaining each bistable circuit at the second state, wherein each bistable circuit includes:

an output-node which is a node for outputting a state signal indicating one of the first state and the second state and which is a node connected to the scanning signal line;

a first switching element having a second electrode supplied with the first clock signal, and a third electrode connected to the output-node;

a first-node connected to a first electrode of the first switching element;

a second switching element having a second electrode connected to the first-node, and a third electrode supplied with a predetermined low potential; and a second-node connected to a first electrode of the second switching element, the first driving step includes:

a first-node charging step of charging the first-node by supplying a predetermined set signal to each bistable circuit;

an output-node charging the state indicated by the state signal from the second state to the first state by changing the potential of the first clock signal from the Low level to the High level; and a first output-node discharging step of changing the state indicated by the state signal from the first state to the second state by supplying a predetermined reset signal to each bistable circuit, the second driving step includes:

a second-node charging step of charging the second-node by changing the potential of the third clock signal from the Low level to the High level; and a first second-node discharging step of discharging the second-node by changing the potential of the fourth clock signal from the Low level to the High level, a duty ratio which is a ratio of a period, during which the potential at the High level is maintained, to a cycle, in which the potential at the High level and the potential at the Low level are repeated with regard to each of the four-phase clock signals, is set to one-half, the first clock signal and the second clock signal are shifted in phase by 180 degrees with respect to each other, the third clock signal and the fourth clock signal are shifted in phase by 180 degrees with respect to each other, and the third clock signal is advanced in phase with respect to the first clock signal.

According to a twenty-first aspect of the present invention, in the twentieth aspect of the present invention, each bistable circuit further includes:

a third switching element having a first electrode and a second electrode each supplied with the third clock signal, and a third electrode connected to the second-node;

a fourth switching element having a first electrode supplied with the fourth clock signal, a second electrode connected to the second-node, and a third electrode supplied with a predetermined low potential; and a fifth switching element having a first electrode and a third electrode each supplied with the set signal, and a second electrode connected to the first-node, in the second-node charging step, the second-node is charged in such a manner that the third switching element is set to the On state based on the third clock signal, in the first second-node discharging step, the second-node is discharged in such a manner that the fourth switching element is set to the On state based on the fourth clock signal, and in the first-node charging step, the first-node is charged in such a manner that the fifth switching element is set to the On state based on the set signal.

According to a twenty-second aspect of the present invention, in the twentieth aspect of the present invention, the first driving step further includes:

a second second-node discharging step of discharging the second-node based on a charging voltage of the first-node; and a second first-node discharging step of discharging the first-node based on the reset signal, each bistable circuit further includes:

a sixth switching element having a first electrode connected to the first-node, a second electrode connected to the second-node, and a third electrode supplied with a predetermined low potential; and a seventh switching element having a first electrode supplied with the reset signal, a second electrode connected to the first-node, and a third electrode supplied with a predetermined low potential, in the second second-node discharging step, the second-node is discharged in such a manner that the sixth switching element is set to the On state based on the charging voltage of the first-node, and in the second first-node discharging step, the first-node is discharged in such a manner that the seventh switching element is set to the On state based on the reset signal.

According to a twenty-third aspect of the present invention, in the twentieth aspect of the present invention, the four-phase clock signals are configured with a first clock signal group including two-phase clock signals which are supplied as the first and second clock signals to each bistable circuit, and a second clock signal group including two-phase clock signals which are supplied as the third and fourth clock signals to each bistable circuit, and when adjacent two bistable circuits are defined as first and second bistable circuits, the first bistable circuit is supplied with, as the first clock signal, one of the two-phase clock signals included in the first clock signal group, is supplied with, as the second clock signal, the other one of the two-phase clock signals included in the first clock signal group, is supplied with, as the third clock signal, one of the two-phase clock signals included in the second clock signal group, is supplied with, as the fourth clock signal, the other one of the two-phase clock signals included in the second clock signal group, and is supplied with, as the reset signal, the state signal outputted from the second bistable circuit, and the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

According to a twenty-fourth aspect of the present invention, in the twentieth aspect of the present invention, the four-phase clock signals are configured with a first clock signal set and a second clock signal set each including the two-phase clock signals shifted in phase by 180 degrees with respect to each other, and when a bistable circuit previous to a certain one of the plurality of bistable circuits is defined as a first bistable circuit and a bistable circuit subsequent to the certain bistable circuit is defined as a second bistable circuit, the first bistable circuit is supplied with, as the first clock signal, one of the two-phase clock signals included in the first clock signal set, is supplied with, as the second clock signal, the other one of the two-phase clock signals included in the first clock signal set, is supplied with, as the third clock signal, one of the two-phase clock signals included in the second clock signal set, is supplied with, as the fourth clock signal, the other one of the two-phase clock signals included in the second clock signal set, and is supplied with, as the reset signal, the state signal outputted from the second bistable circuit, and the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

According to a twenty-fifth aspect of the present invention, in the twentieth aspect of the present invention, the third clock signal is advanced in phase by 90 degrees with respect to the first clock signal.

According to a twenty-sixth aspect of the present invention, in the twentieth aspect of the present invention, each bistable circuit further includes:
an eighth switching element having a first electrode supplied with the reset signal, a second electrode connected to the output-node, and a third electrode supplied with a predetermined low potential; and
a ninth switching element having a first electrode supplied with the second clock signal, a second electrode connected to the output-node, and a third electrode supplied with a predetermined low potential,
each of the first driving step and the second driving step further includes a second output-node discharging step of supplying the second clock signal to the ninth switching element to maintain the state indicated by the state signal at the second state,
in the first output-node discharging step, the state indicated by the state signal changes from the first state to the second state in such a manner that the eighth switching element is set to the On state based on the reset signal, and
in the second output-node discharging step, the state indicated by the state signal is maintained at the second state in such a manner that the ninth switching element is set to the On state based on the second clock signal.

According to a twenty-seventh aspect of the present invention, in the twenty-sixth aspect of the present invention,
each bistable circuit further includes:
a tenth switching element having a first electrode connected to the second-node, a second electrode connected to the output-node, and a third electrode supplied with a predetermined low potential,
each of the first driving step and the second driving step further includes a third output-node discharging step of maintaining the state indicated by the state signal at the second state based on a charging voltage of the second-node, and
in the third output-node charging step, the state indicated by the state signal is maintained at the second state in such a manner that the tenth switching element is set to the On state based on the charging voltage of the second-node.

Effects of the Invention

According to the first aspect of the present invention, in each bistable circuit that forms the shift register in the scanning signal line drive circuit of the display device, the first switching element has the configuration that the first electrode is connected to the first-node, the second electrode is supplied with the first clock signal and the third electrode is connected to the output-node. Hence, when the potential of the first-node rises based on the predetermined set signal and, then, the first clock signal changes from the Low level to the High level, the potential of the first-node further rises due to a parasitic capacitance between the first electrode and second electrode of the first switching element, so that the first switching element turns to the On state. As a result, the potential of the output-node rises, and the state signal indicating the first state is outputted from the output-node. The output-node discharging portion sets the state indicated by the state signal to the second state. On the other hand, when the first clock signal changes from the Low level to the High level in the case where the first-node is not charged, the potential of the first-node rises slightly due to the parasitic capacitance between the first electrode and second electrode of the first switching element. Each bistable circuit includes the first first-node discharging portion for discharging the first-node. The second-node connected to the first electrode of the second switching element included in the first first-node discharging portion is charged based on the third clock signal and discharged based on the fourth clock signal. Herein, the third clock signal is advanced in phase with respect to the first clock signal. Hence, when the first clock signal changes from the Low level to the High level in the non-selection period so that the potential of the first-node rises slightly, the second switching element included in the first first-node discharging portion is already in the On state. Accordingly, in the non-selection period, even when the potential of the first-node rises, the potential falls rapidly. Consequently, a leakage current in the switching element connected to the output-node becomes smaller than that in the conventional case. Thus, it is inhibited that an unnecessary electric current flows through the scanning signal line, which leads to reduction in power consumption.

Moreover, when the first clock signal changes from the High level to the Low level in the non-selection period, the potential of the first-node falls to a potential which is lower than a potential of a (negative) power supply voltage. Herein, since the timing at which the fourth clock signal changes from the Low level to the High level is earlier than the timing at which the first clock signal changes from the High level to the Low level, the second-node is in the discharged state and the second switching element is in the Off state at the point in time that the potential of the first-node falls to the potential which is lower than the potential of the power supply voltage. Hence, the potential of the first-node does not rise rapidly to the potential of the power supply voltage, but rises gradually to the potential of the power supply voltage. As a result, a negative bias voltage is applied satisfactorily to the first electrode of the first switching element in addition to a positive bias voltage through the period that the display device works. Consequently, the threshold shift in the first switching element becomes smaller than that in the conventional case. Accordingly, it is possible to reduce the size of the first switching element as compared with that in the conventional case, which allows size reduction in the display device.

Further, since the fourth clock signal is delayed in phase with respect to the first clock signal, in the selection period, the fourth clock signal changes from the Low level to the High level, so that the second-node is discharged. Herein, the second-node is connected to the first electrode of the second switching element having the second electrode connected to the first-node. As described above, since the period that the second switching element is set to the Off state in the selection period becomes longer than that in the conventional case, it is inhibited that the potential of the first-node falls in the selection period. If the potential of the first-node falls in the selection period, the fall of the scanning signal is delayed at the time of transition from the selection period to the non-selection period. According to the first aspect of the present invention, however, since the fall of the potential of the first-node in the selection period is inhibited, the scanning signal falls rapidly at the time of transition from the selection period to the non-selection period. Hence, it is inhibited that display defect occurs because the fall of the scanning signal becomes slow.

According to the second aspect of the present invention, the same effects as those of the first aspect of the present invention can be obtained with the configuration that each of the second-node discharging portion, the first second-node discharging portion and the first-node charging portion includes the switching element.

According to the third aspect of the present invention, since the second-node is discharged during the selection period, it is prevented that the potential of the first-node falls in the selection period. Moreover, by discharging the first-node after the termination of the selection period, it is inhibited that a leakage current is generated at the first switching element after the termination of the selection period.

According to the fourth aspect of the present invention, a scanning signal line drive circuit producing effects which are similar to those according to the third aspect of the present invention is realized through the configuration that the state signals outputted from the respective bistable circuits are used as the reset signal at the previous stage and the set signal at the subsequent stage.

According to the fifth aspect of the present invention, a relatively thick signal line is used as the signal line transmitting the clock signal contributing directly to setting of the state indicated by the state signal to the first state, and a relatively thin signal line is used as the signal line transmitting the clock signal for controlling the second-node. Hence, it is possible to reduce the circuit area while keeping the operation of the shift register at normal conditions.

According to the sixth aspect of the present invention, a scanning signal line drive circuit producing effects which are similar to those according to the third aspect of the present invention is realized through the configuration that the state signals outputted from the respective bistable circuits are used as the reset signal at the two previous stage and the set signal at the two subsequent stage.

According to the seventh aspect of the present invention, the state indicated by the state signal is set to the second state based on the reset signal and the second clock signal. Hence, it is possible to set the state indicated by the state signal to the second state at any time.

According to the eighth aspect of the present invention, the state indicated by the state signal is further set to the second state based on the charging voltage of the second-node. Hence, it is possible to maintain the state indicated by the state signal in the non-selection period at the second state with reliability.

According to the ninth aspect of the present invention, the potential of the first-node is maintained at the High level during the selection period. Hence, it is inhibited that the potential of the scanning signal falls in the selection period.

According to the tenth aspect of the present invention, the first to fourth clock signals are generated with relative ease.

According to the eleventh aspect of the present invention, a scanning signal line drive circuit producing effects which are similar to those according to the first aspect of the present invention is realized through the configuration that the two scanning signal line drive circuits are provided.

According to the twelfth aspect of the present invention, the same effects as those of the eleventh aspect of the present invention can be obtained with the configuration that the odd-numbered scanning signal lines and the even-numbered scanning signal lines are driven by the different scanning signal line drive circuits.

According to the thirteenth aspect of the present invention, the same effects as those of the eleventh aspect of the present invention can be obtained with the configuration that each scanning signal line is driven by the two scanning signal line drive circuits.

According to the fourteenth aspect of the present invention, as the thin-film transistors made of microcrystalline silicon that is relatively insusceptible to degradation are employed as the switching element, it is possible to enhance the reliability of the operation of the shift register.

According to the fifteenth aspect of the present invention, in the configuration in which the thin-film transistors made of amorphous silicon are employed as the switching element, a leakage current in the first switching element becomes more smaller, and unnecessary power consumption is suppressed.

According to the sixteenth aspect of the present invention, as the switching element (the second switching element, the seventh switching element) for discharging the first-node is configured with the thin-film transistor having the multi-channel structure, it is possible to prevent the potential of the first-node from decreasing due to a leakage current in these switching elements when the potential of the first-node increases.

According to the seventeenth aspect of the present invention, a display device including a scanning signal line drive circuit producing effects which are similar to those according to the first aspect of the present invention is realized.

According to the eighteenth aspect of the present invention, a display device producing effects which are similar to those according to the seventeenth aspect of the present invention is realized while achieving reduction in device size.

According to the nineteenth aspect of the present invention, a shift register producing effects which are similar to those according to the first aspect of the present invention is realized.

BRIEF DESCRIPTION OF THE DRAWINGS

FIG. 10 is a partially enlarged diagram of the results of simulation.

FIG. 11 is a partially enlarged diagram of the results of simulation.

FIG. 16 is a waveform chart showing an operation in the conventional example.

MODES FOR CARRYING OUT THE INVENTION

One embodiment of the present invention will be described below with reference to the attached drawings. In the following description, with regard to a thin-film transistor, a gate terminal (a gate electrode) corresponds to a first electrode, a source terminal (a source electrode) corresponds to a second electrode, and a drain terminal (a drain electrode) corresponds to a third electrode.

<1. General Configuration and Operation>

Figure 2:
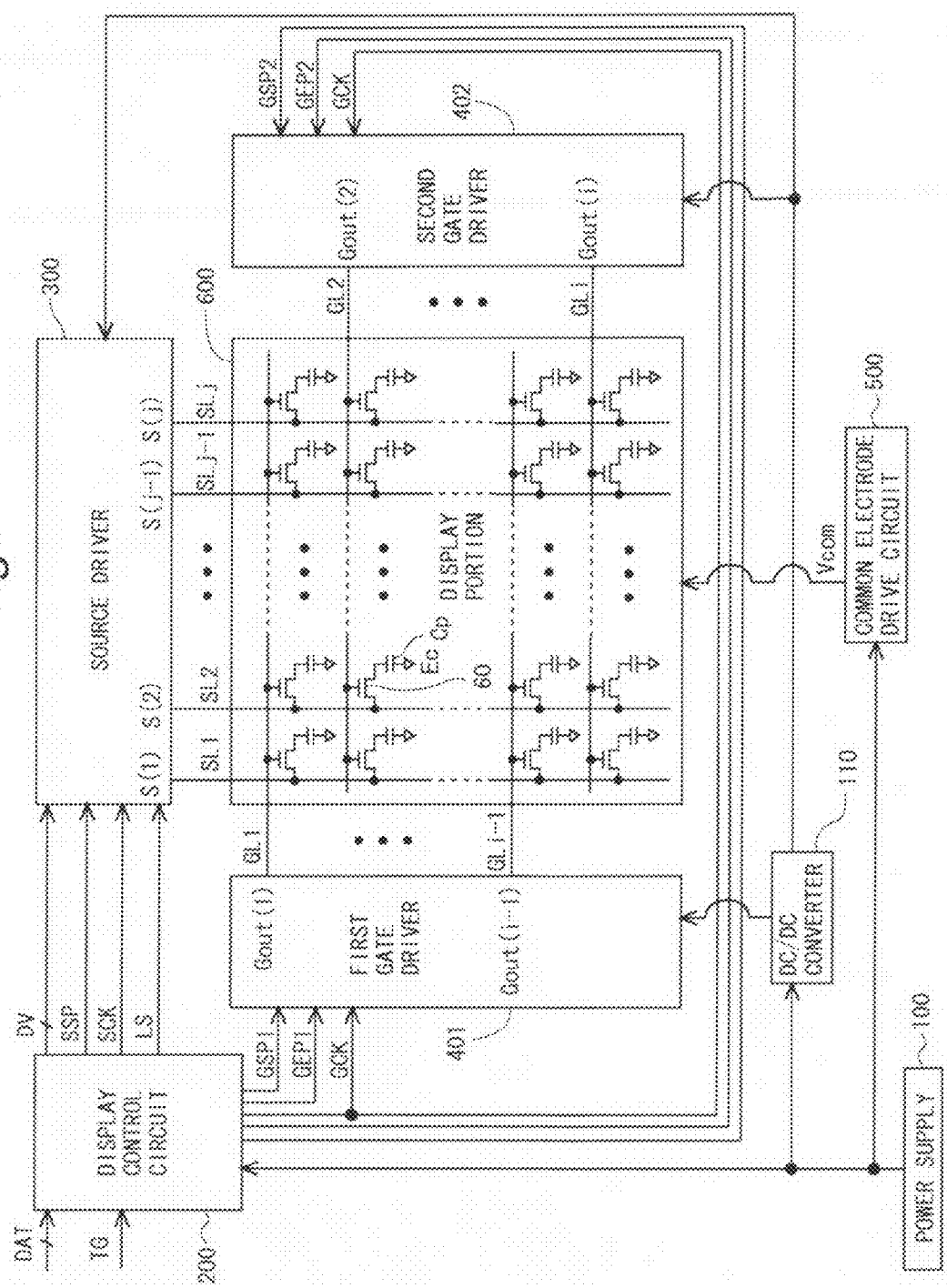
FIG. 2 is a block diagram showing a general configuration of the liquid crystal display device according to the embodiment.

FIG. 2 is a block diagram showing a general configuration of an active matrix-type liquid crystal display device according to one embodiment of the present invention. As shown in FIG. 2, this liquid crystal display device includes a power supply 100, a DC/DC converter 110, a display control circuit 200, a source driver (a video signal line drive circuit) 300, a first gate driver (a first scanning signal line drive circuit) 401, a second gate driver (a second scanning signal line drive circuit) 402, a common electrode drive circuit 500 and a display portion 600. Typically, the display portion 600 as well as the first and second gate drivers 401 and 402 each of which is a drive circuit are formed on a single substrate, that is, are formed in a monolithic manner.

The display portion 600 includes a plurality of (j) source bus lines (video signal lines) SL1 to SLj, a plurality of (i) gate bus lines (scanning signal lines) GL1 to GLi, and a plurality of (i×j) pixel formation portions provided in correspondence with intersections between the source bus lines SL1 to SLj and the gate bus lines GL1 to GLi, respectively. Among the "i" gate bus lines GL1 to GLi, the odd-numbered gate bus lines GL1, GL3, . . . , and GLi−1 are arranged to extend from the first gate driver 401, and the even-numbered gate bus lines GL2, GL4, . . . , and GLi are arranged to extend from the second gate driver 402.

The plurality of pixel formation portions are arranged in a matrix shape to form a pixel array. Each pixel formation portion includes a thin-film transistor (TFT) 60 which is a switching element having a gate terminal connected to the gate bus line passing the corresponding intersection and a source terminal connected to the source bus line passing the intersection, a pixel electrode connected to a drain terminal of the thin-film transistor 60, a common electrode Ec which is a counter electrode provided in common for the plurality of pixel formation portions, and a liquid crystal layer provided in common for the plurality of pixel formation portions and held between the pixel electrode and the common electrode Ec. A liquid crystal capacitance to be formed by the pixel electrode and the common electrode Ec forms a pixel capacitance Cp. Usually, an auxiliary capacitance is provided in parallel to the liquid crystal capacitance in order that the pixel capacitance Cp holds a voltage with reliability. However, since the auxiliary capacitance is not directly related to the present invention, the description and illustration thereof will not be given.

The power supply 100 supplies a predetermined power supply voltage to each of the DC/DC converter 110, the display control circuit 200 and the common electrode drive circuit 500. The DC/DC converter 110 generates a predetermined DC voltage from the power supply voltage in order to operate the source driver 300, the first gate driver 401 and the second gate driver 402, and supplies the DC voltage to each of the source driver 300, the first gate driver 401 and the second gate driver 402. The common electrode drive circuit 500 supplies a predetermined potential Vcom to the common electrode Ec.

The display control circuit 200 receives an externally transmitted image signal DAT and an externally transmitted timing signal group TG such as a horizontal synchronizing signal, a vertical synchronizing signal and the like, and outputs a digital video signal DV as well as a source start pulse signal SSP, a source clock signal SCK, a latch strobe signal LS, a first gate start pulse signal GSP1, a first gate end pulse signal GEP1, a second gate start pulse signal GSP2, a second gate end pulse signal GEP2 and a gate clock signal GCK which are for controlling the image display on the display portion 600.

The source driver 300 receives the digital video signal DV, the source start pulse signal SSP, the source clock signal SCK and the latch strobe signal LS each outputted from the display control circuit 200, and applies driving video signals. S(1) to S(j) to the source bus lines SL1 to SLj, respectively. In this embodiment, the gate driver is classified into the first gate driver 401 for driving the odd-numbered gate bus lines GL1, GL3, . . . , and GLi−1, and the second gate driver 402 for driving the even-numbered gate bus lines GL2, GL4, . . . , and GLi. The first gate driver 401 applies active scanning signals Gout(1), Gout(3), . . . , and Gout(i−1) to the odd-numbered gate bus lines GL1, GL3, . . . , and GLi−1 repeatedly, based on the first gate start pulse signal GSP1, the first gate end pulse signal GEP1 and the gate clock signal GCK each outputted from the display control circuit 200, with one vertical scanning period defined as a cycle. Likewise, the second gate driver 402 applies active scanning signals Gout(2), Gout(4), . . . , and Gout(i) to the even-numbered gate bus lines GL2, GL4, . . . , and GLi repeatedly, based on the second gate start pulse signal GSP2, the second gate end pulse signal GEP2 and the gate clock signal GCK each outputted from the display control circuit 200, with one vertical scanning period defined as a cycle. The detailed description of these gate drivers will be given later.

As described above, the driving video signals S(1) to S(j) are applied to the source bus lines SL1 to SLj, respectively, and the scanning signals Gout(1) to Gout(i) are applied to the gate bus lines GL1 to GLi, respectively, so that an image based on the externally transmitted image signal DAT is displayed on the display portion 600.

<2. Configuration and Operation of Gate Driver>

Figure 3:
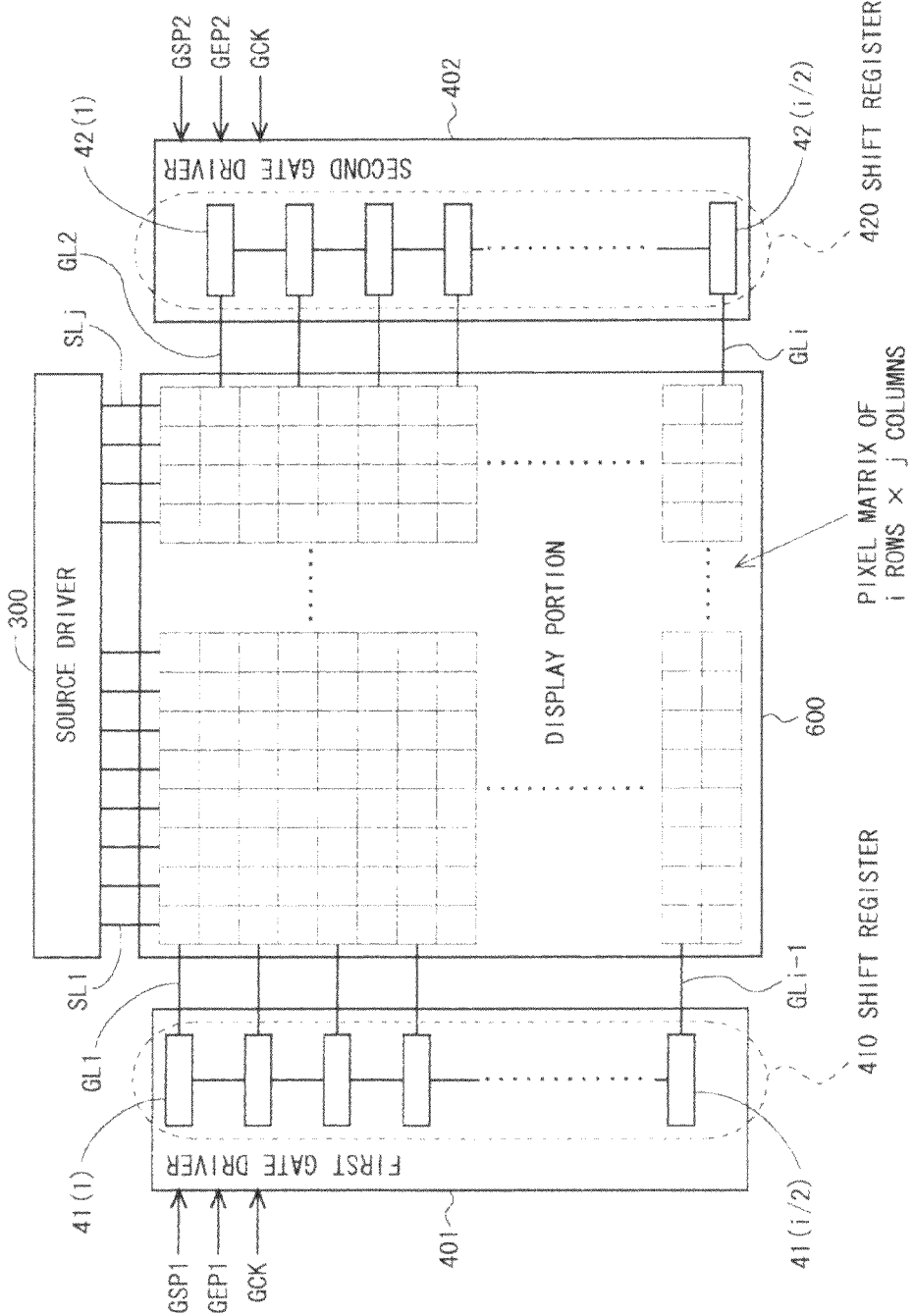
FIG. 3 is a block diagram for explaining a configuration of the gate driver, in the embodiment.

With regard to a configuration and an operation of the gate driver in this embodiment, next, the general outlines will be described with reference to FIG. 3 to FIG. 6. As shown in FIG. 3, the first gate driver 401 is configured with a multi-stage shift register 410, and the second gate driver 402 is configured with a multi-stage shift register 420. A pixel matrix ("i" rows×"j" columns) is formed on the display portion 600. The respective stages of the shift register 410 are provided in one-to-one correspondence with the odd-numbered rows in the pixel matrix, and the respective stages of the shift register 420 are provided in one-to-one correspondence with the even-numbered rows in the pixel matrix. Moreover, each of the stages of the shift registers 410 and 420 is a bistable circuit that turns to one of two states (a first state and a second state) at each point in time, and outputs a signal indicating the relevant state (hereinafter, referred to as a "state signal"). Thus, the shift register 410 is configured with the "i/2" bistable circuits 41(1) to 41(i/2), and the shift register 420 is configured with the "i/2" bistable circuits 42(1) to 42(i/2). In this embodiment, when the bistable circuit is in the first state, a state signal at a High level (H level) is outputted from the bistable circuit. On the other hand, when the bistable circuit is in the second state, a state signal at a Low level (L level) is outputted from the bistable circuit.

Figure 4:
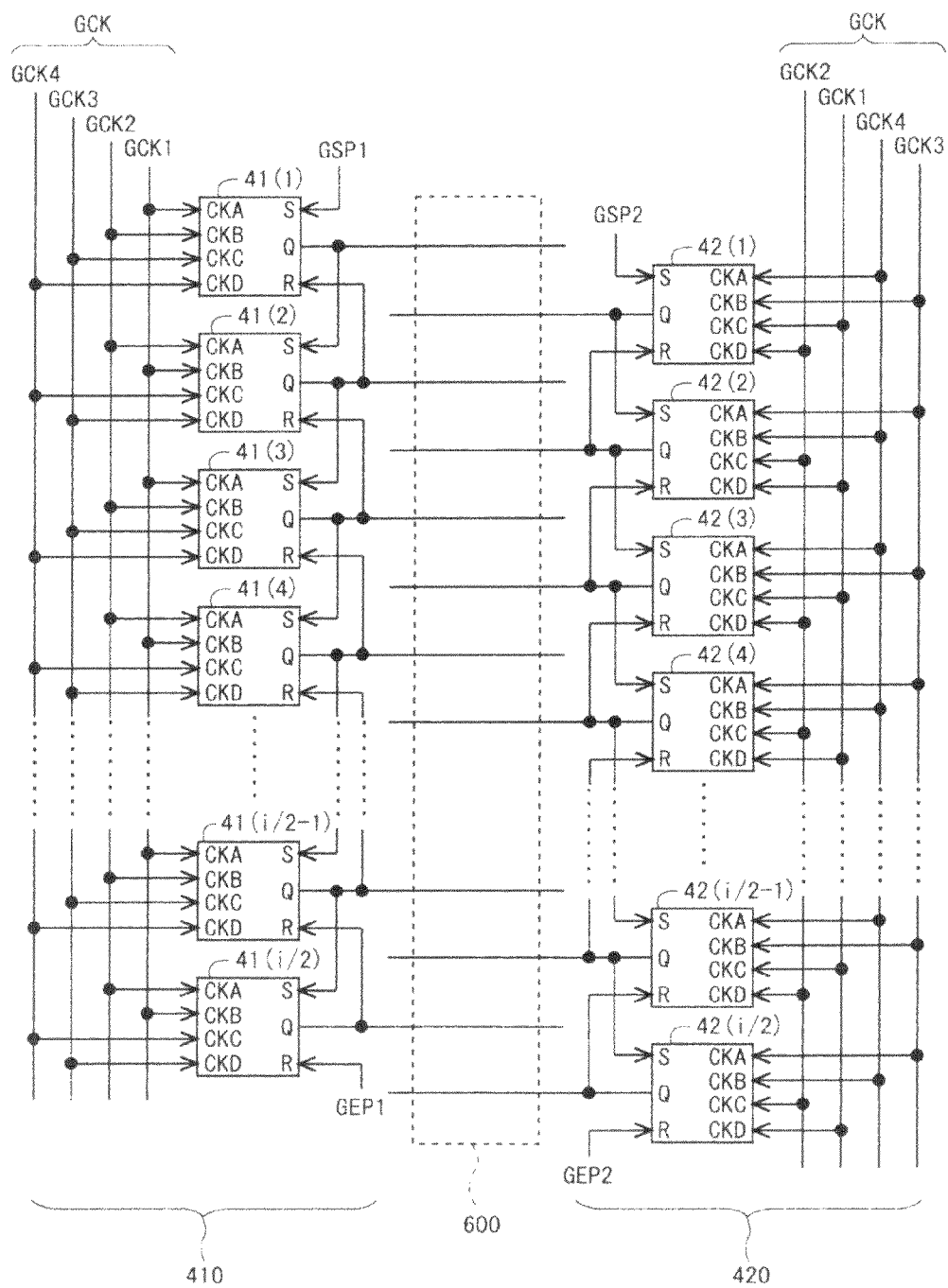
FIG. 4 is a block diagram showing a configuration of the shift register in the gate driver, in the embodiment.

FIG. 4 is a block diagram showing the configurations of the shift registers 410 and 420 in the gate driver. As described above, the shift register 410 is configured with the "i/2" bistable circuits 41(1) to 41(i/2), and the shift register 420 is configured with the "i/2" bistable circuits 42(1) to 42(i/2). Each bistable circuit is provided with input terminals for receiving four clock signals CKA (hereinafter, referred to as a "first clock"), CKB (hereinafter, referred to as a "second clock"), CKC (hereinafter, referred to as a "third clock") and CKD (hereinafter, referred to as a "fourth clock"), an input terminal for receiving a set signal S, an input terminal for receiving a reset signal R, and an output terminal for outputting a state signal Q.

The shift register 410 in the first gate driver 401 is supplied with, from the display control circuit 200, four clock signals GCK1 (hereinafter, referred to as a "first gate clock signal"), GCK2 (hereinafter, referred to as a "second gate clock signal"), GCK3 (hereinafter, referred to as a "third gate clock signal") and GCK4 (hereinafter, referred to as a "fourth gate clock signal") each serving as the gate clock signal GCK, a first gate start pulse signal GSP1, and a first gate end pulse signal GEP1. The shift register 420 in the second gate driver 402 is supplied with, from the display control circuit 200, a first gate clock signal GCK1, a second gate clock signal GCK2, a third gate clock signal GCK3, a fourth gate clock signal GCK4, a second gate start pulse signal GSP2 and a second gate end pulse signal GSP2.

Figure 5:
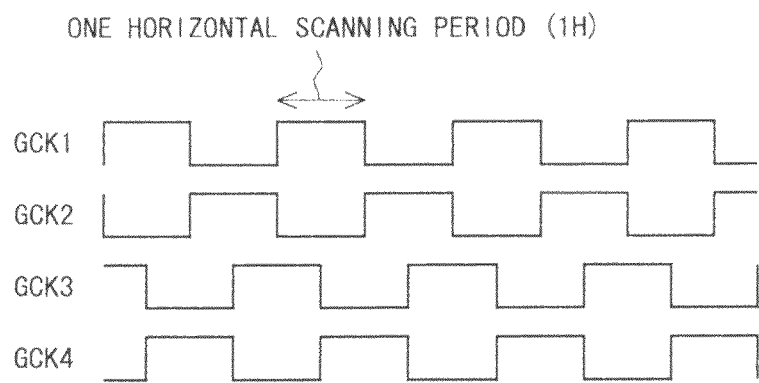
FIG. 5 is a signal waveform chart showing waveforms of first to fourth gate clock signals, in the embodiment.

As shown in FIG. 5, the first gate clock signal GCK1 and the second gate clock signal GCK2 are shifted in phase by 180 degrees (the period corresponding to one horizontal scanning period) with respect to each other, and the third gate clock signal GCK3 and the fourth gate clock signal GCK4 are shifted in phase by 180 degrees with respect to each other. The third gate clock signal GCK3 is advanced in phase by 90 degrees with respect to the first gate clock signal GCK1. Each of the first to fourth gate clock signals GCK1 to 4 turns to the state of the High level (H level) every one horizontal scanning period. In this embodiment, the signals to be supplied to the input terminals of each stage (each bistable circuit) in the shift register 410 are as follows. In the first stage 41(1), the first gate clock signal GCK1 is supplied as the first clock CKA, the second gate clock signal GCK2 is supplied as the second clock CKB, the third gate clock signal GCK3 is supplied as the third clock CKC, and the fourth gate clock signal GCK4 is supplied as the fourth clock CKD. In the second stage 41(2), the second gate clock signal GCK2 is supplied as the first clock CKA, the first gate clock signal GCK1 is supplied as the second clock CKB, the fourth gate clock signal GCK4 is supplied as the third clock CKC, and the third gate clock signal GCK3 is supplied as the fourth clock CKD. In the third stage and the stages subsequent thereto, configurations which are similar to the configurations from the first stage to the second stage are repeated every two stages. In the first stage 41(1), moreover, the first gate start pulse signal GSP1 is supplied as the set signal S. In the second stage 41(2) and the stages subsequent thereto, the state signal Q at the previous stage is supplied as the set signal S. In the first to (i/2−1)-th stages, further, the state signal Q at the subsequent stage is supplied as the reset signal R. In the (i/2)-th stage, the first gate end pulse signal GEP1 is supplied as the reset signal R.

The signals to be supplied to the input terminals of each stage (each bistable circuit) in the shift register 420 are as follows. In the first stage 42(1), the fourth gate clock signal GCK4 is supplied as the first clock CKA, the third gate clock signal GCK3 is supplied as the second clock CKB, the first gate clock signal GCK1 is supplied as the third clock CKC, and the second gate clock signal GCK2 is supplied as the fourth clock CKD. In the second stage 42(2), the third gate clock signal GCK3 is supplied as the first clock CKA, the fourth gate clock signal GCK4 is supplied as the second clock CKB, the second gate clock signal GCK2 is supplied as the third clock CKC, and the first gate clock signal GCK1 is supplied as the fourth clock CKD. In the third stage and the stages subsequent thereto, configurations which are similar to the configurations from the first stage to the second stage are repeated every two stages. In the first stage 42(1), moreover, the second gate start pulse signal GSP2 is supplied as the set signal S. In the second stage 42(2) and the stages subsequent thereto, the state signal Q at the previous stage is supplied as the set signal S. In the first to (i/2−1)-th stages, further, the state signal Q at the subsequent stage is supplied as the reset signal R. In the (i/2)-th stage, the second gate end pulse signal GEP2 is supplied as the reset signal R.

When the first gate start pulse signal GSP1 is supplied as the set signal S to the first stage 41(1) in the shift register 410, the pulse contained in the first gate start pulse signal GSP1 (this pulse is contained in the state signal Q outputted from each stage) is transferred sequentially from the first stage 41(1) to the (i/2)-th stage 41(i/2), based on the first to fourth gate clock signals GCK1 to 4. In response to this pulse transfer, then, the state signals Q outputted from the respective stages 41(1) to (i/2) turn to the High level sequentially. Then, the state signals Q outputted from the respective stages 41(1) to (i/2) are supplied as the scanning signals to the odd-numbered gate bus lines GL1, GL3, . . . , and GLi−1, respectively.

When the second gate start pulse signal GSP2 is supplied as the set signal S to the first stage 42(1) in the shift register 420, the pulse contained in the second gate start pulse signal GSP2 is transferred sequentially from the first stage 42(1) to the (i/2)-th stage 42(i/2), based on the first to fourth gate clock signals GCK1 to 4. In response to this pulse transfer, then, the state signals Q outputted from the respective stages 42(1) to (i/2) turn to the High level sequentially. Then, the state signals Q outputted from the respective stages 42(1) to (i/2) are supplied as the scanning signals to the even-numbered gate bus lines GL2, GL4, . . . , and GLi, respectively.

Figure 6:
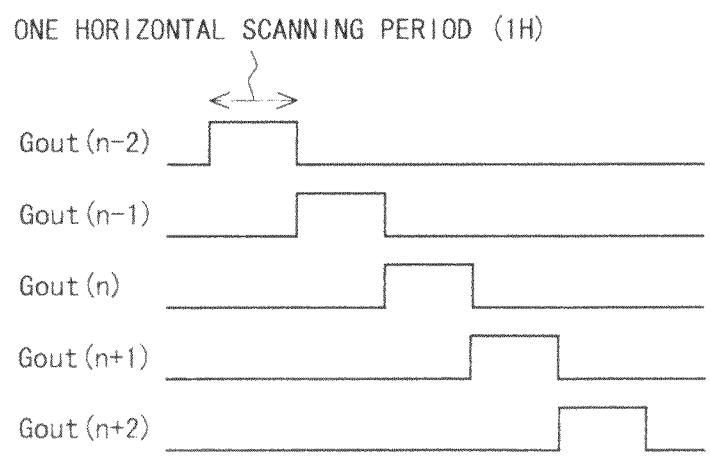
FIG. 6 is a signal waveform chart showing waveforms of scanning signals, in the embodiment.

As shown in FIG. 6, the scanning signals that turn to the High level sequentially every one horizontal scanning period are supplied to the gate bus lines in the display portion 600 as described above.

With regard to the configuration of the shift register 410 shown in FIG. 4, a relatively thick signal line is used as each of the signal line transmitting the first gate clock signal GCK1 and the signal line transmitting the second gate clock signal GCK2, and a relatively thin signal line is used as each of the signal line transmitting the third gate clock signal GCK3 and the signal line transmitting the fourth gate clock signal GCK4. With regard to the configuration of the shift register 420 shown in FIG. 4, moreover, a relatively thick signal line is used as each of the signal line transmitting the third gate clock signal GCK3 and the signal line transmitting the fourth gate clock signal GCK4, and a relatively thin signal line is used as each of the signal line transmitting the first gate clock signal GCK1 and the signal line transmitting the second gate clock signal GCK2. In other words, a relatively thick signal line is used as a signal line transmitting a clock signal contributing directly to the rise of a potential of a scanning signal, and a relatively thin signal line is used as a signal line transmitting a clock signal for controlling an operation of an after-mentioned thin-film transistor (to be described later) included in each bistable circuit.

<3. Configuration of Bistable Circuit>

Figure 1:
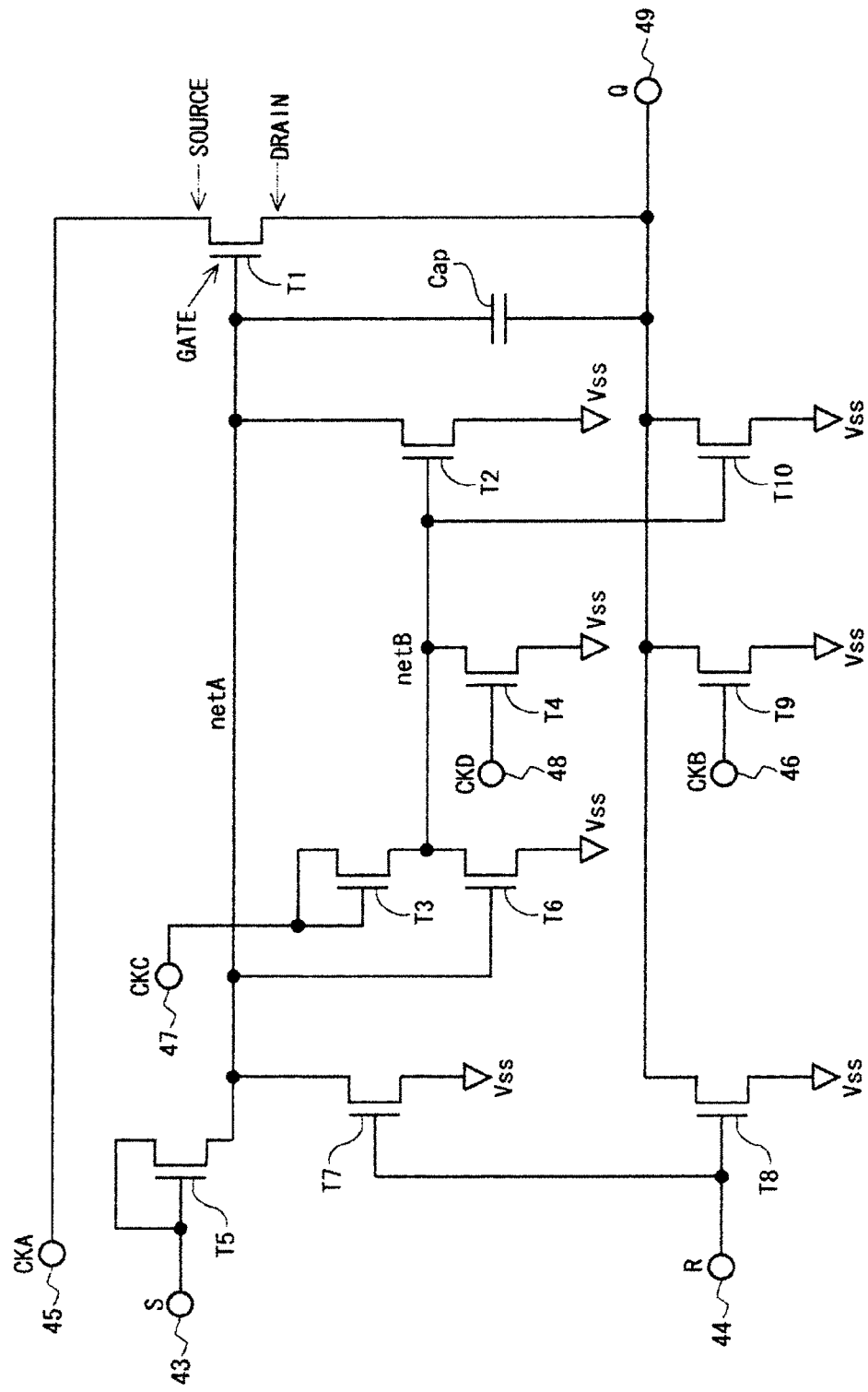
FIG. 1 is a circuit diagram showing a configuration of a bistable circuit included in a shift register in a gate driver of a liquid crystal display device according to one embodiment of the present invention.

FIG. 1 is a circuit diagram showing the configuration of the bistable circuit included in each of the shift registers 410 and 420 described above (the configuration corresponding to one stage in each of the shift registers 410 and 420). As shown in FIG. 1, the bistable circuit includes 10 thin-film transistors T1 (a first switching element), T2 (a second switching element), T3 (a third switching element), T4 (a fourth switching element), T5 (a fifth switching element), T6 (a sixth switching element), T7 (a seventh switching element), T8 (an eighth switching element), T9 (a ninth switching element) and T10

(a tenth switching element), and a capacitor Cap. Moreover, the bistable circuit has six input terminals 43 to 48, and one output terminal (output-node) 49. Herein, the input terminal that receives a set signal S is denoted with the reference symbol 43, the input terminal that receives a reset signal R is denoted with the reference symbol 44, the input terminal that receives a first clock CKA is denoted with the reference symbol 45, the input terminal that receives a second clock CKB is denoted with the reference symbol 46, the input terminal that receives a third clock CKC is denoted with the reference symbol 47, the input terminal that receives a fourth clock CKD is denoted with the reference symbol 48, and the output terminal that outputs a state signal Q is denoted with the reference symbol 49. The following description is given of the connection relation between the constituent elements in the bistable circuit.

The gate terminal of the thin-film transistor T1, the source terminal of the thin-film transistor T2, the source terminal of the thin-film transistor T5, the gate terminal of the thin-film transistor T6, and the source terminal of the thin-film transistor T7 are connected to one another. Herein, a region (wiring) where these elements are connected to one another will be referred to as "netA" (a first-node) for convenience of the description.

The gate terminal of the thin-film transistor T2, the drain terminal of the thin-film transistor T3, the source terminal of the thin-film transistor T4, the source terminal of the thin-film transistor T6, and the gate terminal of the thin-film transistor T10 are connected to one another. Herein, a region (wiring) where these elements are connected to one another will be referred to as "netB" (a second-node) for convenience of the description.

In the thin-film transistor T1, the gate terminal is connected to netA, the source terminal is connected to the input terminal 45, and the drain terminal is connected to the output terminal 49. In the thin-film transistor T2, the gate terminal is connected to netB, the source terminal is connected to netA, and the drain terminal is connected to a power supply voltage Vss. In the thin-film transistor T3, each of the gate terminal and the source terminal is connected to the input terminal 47, and the drain terminal is connected to netB. In the thin-film transistor T4, the gate terminal is connected to the input terminal 48, the source terminal is connected to netB, and the drain terminal is connected to the power supply voltage Vss. In the thin-film transistor T5, each of the gate terminal and the drain terminal is connected to the input terminal 43 (i.e., establishes diode-connection), and the source terminal is connected to netA.

In the thin-film transistor T6, the gate terminal is connected to netA, the source terminal is connected to netB, and the drain terminal is connected to the power supply voltage Vss. In the thin-film transistor T7, the gate terminal is connected to the input terminal 44, the source terminal is connected to netA, and the drain terminal is connected to the power supply voltage Vss. In the thin-film transistor T8, the gate terminal is connected to the input terminal 44, the source terminal is connected to the output terminal 49, and the drain terminal is connected to the power supply voltage Vss. In the thin-film transistor T9, the gate terminal is connected to the input terminal 46, the source terminal is connected to the output terminal 49, and the drain terminal is connected to the power supply voltage Vss. In the thin-film transistor T10, the gate terminal is connected to netB, the source terminal is connected to the output terminal 49, and the drain terminal is connected to the power supply voltage Vss. In the capacitor Cap, one end is connected to netA, and the other end is connected to the output terminal 49.

The following description is given of the functions of the respective constituent elements in the bistable circuit. The thin-film transistor T1 supplies a potential of the first clock CKA to the output terminal 49 when a potential of netA is in the High level. The thin-film transistor T2 sets the potential of netA to the Low level when a potential of netB is in the High level. The thin-film transistor T3 sets the potential of netB to the High level when the third clock CKC is in the High level. The thin-film transistor T4 sets the potential of netB to the Low level when the fourth clock CKD is in the High level. Herein, by setting the potential of netB to the Low level by the thin-film transistor T4, it is prevented that a bias voltage is applied to each of the thin-film transistors T2 and T10 for a long period of time. As a result, it is prevented that each of the thin-film transistors T2 and T10 fails to serve as a switch because of the rise of threshold voltage of the thin-film transistor. the thin-film transistor T5 raises the potential of netA when the set signal S at the High level is inputted.

The thin-film transistor T6 sets the potential of netB to the Low level when the potential of netA is in the High level. The thin-film transistor T7 sets the potential of netA to the Low level when the reset signal R at the High level is inputted. The thin-film transistor T8 sets a potential of the state signal Q to the Low level when the reset signal R at the High level is inputted. The thin-film transistor T9 sets the potential of the state signal Q to the Low level when the second clock CKB is in the High level. The thin-film transistor T10 sets the potential of the state signal Q to the Low level when the potential of netB is in the High level. The capacitor Cap serves as an auxiliary capacitance for maintaining the potential of netA at the High level during the selection period.

In this embodiment, an output-node charging portion is realized by the thin-film transistor T1, a first output-node discharging portion is realized by the thin-film transistor T8, a second output-node discharging portion is realized by the thin-film transistor T9, and a third output-node discharging portion is realized by the thin-film transistor T10. Moreover, a first-node charging portion is realized by the thin-film transistor T5, a first first-node discharging portion is realized by the thin-film transistor T2, and a second first-node discharging portion is realized by the thin-film transistor T7. Further, a second-node charging portion is realized by the thin-film transistor T3, a first second-node discharging portion is realized by the thin-film transistor T4, and a second second-node discharging portion is realized by the thin-film transistor T6.

<4. Operation of Bistable Circuit>
<4.1 General Outline of Operation>

Figure 7:
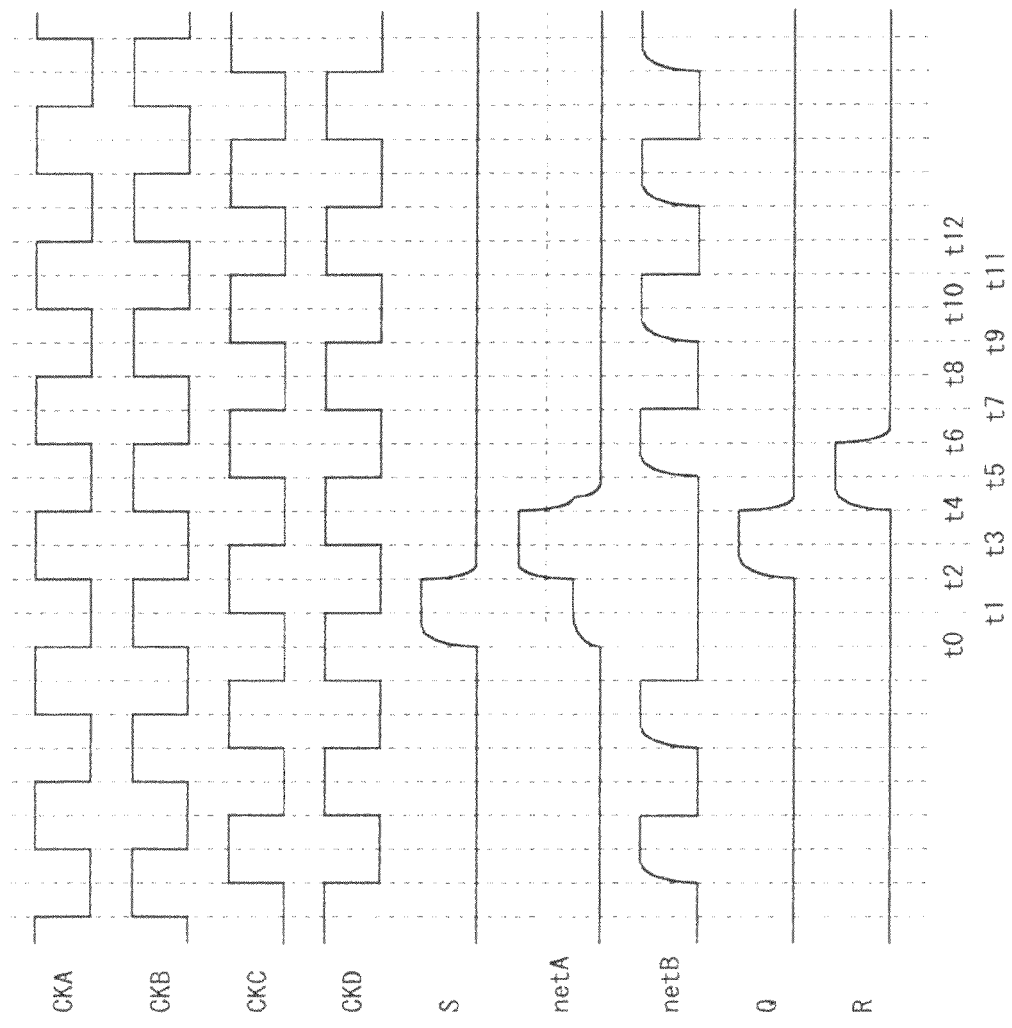
FIG. 7 is a waveform chart for explaining an operation of the bistable circuit, in the embodiment.

The general outline of the operation of the bistable circuit in this embodiment will be described with reference to FIG. 1 and FIG. 7. The following description is given of the general outline of the operation; therefore, the slight variations in potential with regard to netA, netB and state signal Q are ignored. It is assumed herein that a period from a point in time t2 to a point in time t4 in FIG. 7 is a period (a selection period) during which the gate bus line connected to the output terminal 49 of the bistable circuit should be set to a selected state. Moreover, a driving operation based on a first driving step is executed during a period from a point in time t0 to a point in time t6 in FIG. 7, and a driving operation based on a second driving step is executed during the remaining period.

During the operation of the liquid crystal display device, the first clock CKA, the second clock CKB, the third clock CKC and the fourth clock CKD each having a waveform shown in FIG. 7 are supplied to the input terminals 45 to 48 of the bistable circuit, respectively.

At the point in time t0, the pulse of the set signal S is supplied to the input terminal 43. Since the thin-film transistor T5 is configured to be diode-connected to the input terminal 43, the potential of netA rises by this pulse of the set signal S. Since the set signal S is maintained at the state of the High level until the point in time t2, netA is precharged during the period from t0 to t2. Since the gate terminal of the thin-film transistor T6 is connected to netA, the thin-film transistor T6 is maintained at the On state during this period. Thus, the thin-film transistor T2 is maintained at the Off state during the period from t0 to t2. Moreover, since the reset signal R is maintained at the Low level during this period, the thin-film transistor T7 is maintained at the Off state. Accordingly, there is no possibility that the potential of netA, which rises by the precharge, falls during this period.

At the point in time t1, the third clock CKC changes from the Low level to the High level. Herein, since the thin-film transistor T3 is configured to be diode-connected to the input terminal 47, the potential of netB is intended to rise. However, as described above, the thin-film transistor T6 is maintained at the On state during the period of the points in time t0 to t2. Hence, the potential of netB is maintained at the Low level even after the point in time t1.

Figure 8:
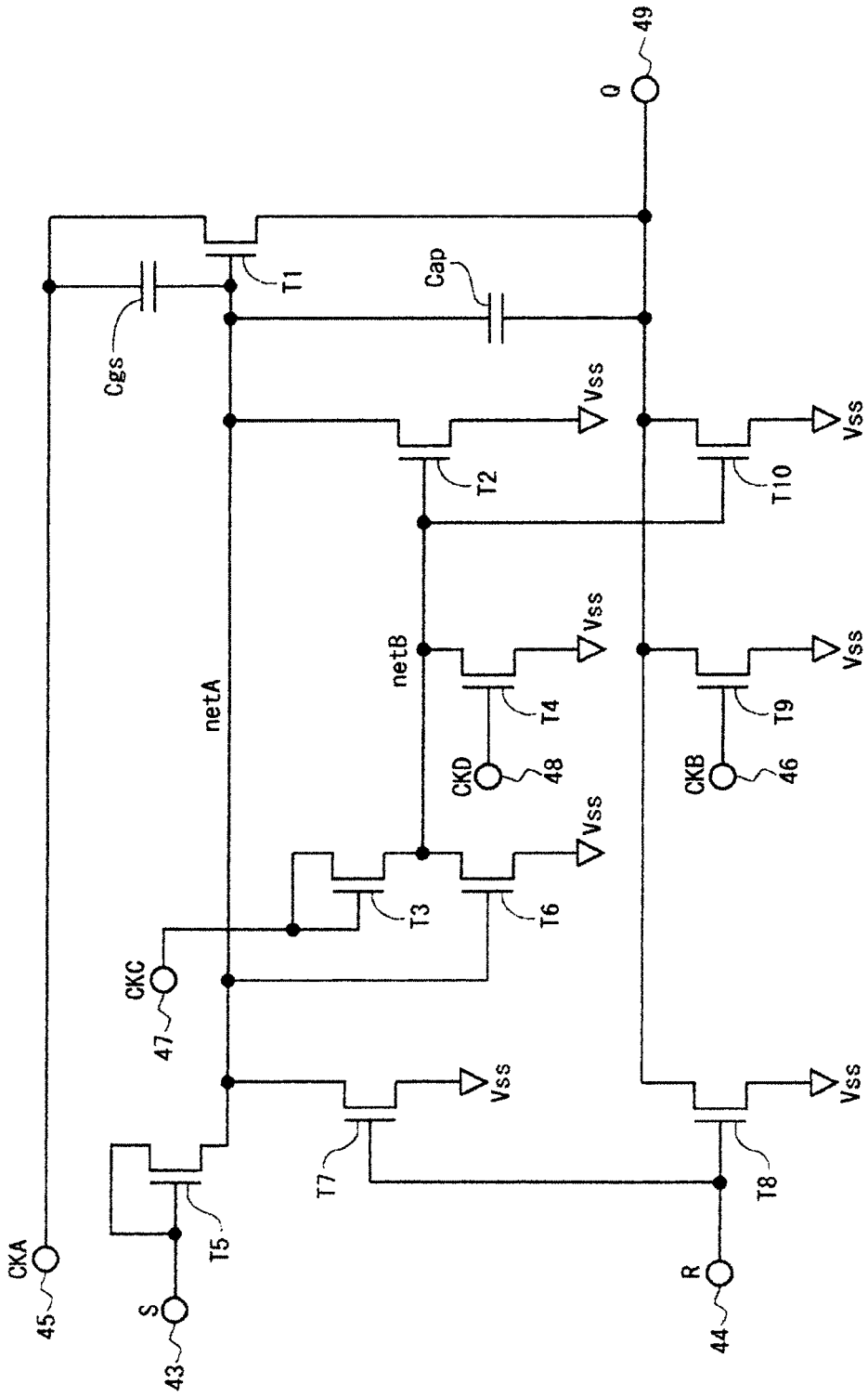
FIG. 8 is a circuit diagram with a parasitic capacitance between a gate and a source of a thin-film transistor T1 taken into consideration, in the embodiment.

At the point in time t2, the first clock CKA changes from the Low level to the High level. Herein, the source terminal of the thin-film transistor T1 is connected to the input terminal 45, and the parasitic capacitance Cgs is formed between the gate and source of the thin-film transistor T1 as shown in FIG. 8. Hence, according to a rise of the source potential of the thin-film transistor T1, the potential of netA also rises (netA is bootstrapped). Consequently, the thin-film transistor T1 turns to the On state. Since the state that the first clock CKA is set to the High level is maintained until the point in time t4, the state signal Q is in the High level during the period from t2 to t4. As a result, the gate bus line connected to the bistable circuit that outputs the state signal Q at the High level turns to the selected state, and the video signal is written to the pixel capacitance Cp in the pixel formation portion on the row corresponding to this gate bus line. During the period from t2 to t4, since the thin-film transistor T6 is maintained at the On state, the potential of netB is maintained at the Low level, and the thin-film transistor T2 is maintained at the Off state. Moreover, during the period from t2 to t4, since the reset signal R is maintained at the Low level, the thin-film transistors T7 and T8 are each maintained at the Off state. Hence, there is no possibility that the potential of netA and the potential of the state signal Q (the output terminal 49) fall during this period.

At the point in time t3, the fourth clock CKD changes from the Low level to the High level. The state that the fourth clock CKD is set to the High level is maintained until the point in time t5. As a result, the thin-film transistor T4 is in the On state and the potential of netB is maintained at the Low level during the period from t3 to t5.

At the point in time t4, the first clock CKA changes from the High level to the Low level. Moreover, the reset signal R changes from the Low level to the High level. As a result, the thin-film transistors T7 and T8 turn to the On state. By turning the thin-film transistor T7 to the On state, the potential of netA falls. By turning the thin-film transistor T8 to the On state, the potential of the state signal Q (the output terminal 49) falls. Since the state that the reset signal R is set to the High level is maintained until the point in time t6, the potentials of netA and state signal Q, which fall at the point in time t4, are each maintained at the Low level during the period from t4 to t6.

At the point in time t5, the third clock CKC changes from the Low level to the High level. Moreover, the fourth clock CKD changes from the High level to the Low level. Hence, the thin-film transistor T4 turns to the Off state. At the point in time t5, moreover, since the potential of netA is in the Low level and the thin-film transistor T6 is in the Off state, the potential of netB rises by the change of the third clock CKC to the High level. Since the state that the third clock CKC is set to the High level is maintained until the point in time t7, the thin-film transistors T2 and T10 are in the On state during the period from t5 to t7. Accordingly, the potential of netA and the potential of the state signal Q are each maintained at the Low level during this period.

At the point in time t6, the reset signal R changes from the High level to the Low level. Moreover, the first clock CKA changes from the Low level to the High level. At this time, the potential of netA is intended to rise due to the parasitic capacitance Cgs described above. However, since the thin-film transistor T2 is in the On state as described above, the potential of netA is maintained at the Low level.

At the point in time t7, the third clock CKC changes from the High level to the Low level. Moreover, the fourth clock CKD changes from the Low level to the High level. As a result, the thin-film transistor T3 turns to the Off state, the thin-film transistor T4 turns to the On state, and the potential of netB falls. Since the state that the fourth clock CKD is set to the High level is maintained until the point in time t9, the potential of netB is maintained at the Low level during the period from t7 to t9.

During the period from t8 to t10, since the first clock CKA and the set signal S are each maintained at the Low level, the potentials of netA and state signal Q are each maintained at the Low level. At the point in time t9, the fourth clock CKD changes from the High level to the Low level and the third clock CKC changes from the Low level to the High level, so that the potential of netB rises. As a result, the thin-film transistors T2 and T10 each turn to the On state. Hence, the potentials of netA and state signal Q are each maintained at the Low level with reliability during the period from t9 to t10.

At the point in time t10, the first clock CKA changes from the Low level to the High level. At this time, the potential of netA is intended to rise due to the parasitic capacitance Cgs described above. However, since the thin-film transistor T2 is in the On state as described above, the potential of netA is maintained at the Low level.

At the point in time t11, the third clock CKC changes from the High level to the Low level. Moreover, the fourth clock CKD changes from the Low level to the High level. As a result, the thin-film transistor T3 turns to the Off state, the thin-film transistor T4 turns to the On state, and the potential of netB falls. At the period subsequent to the point in time t12, operations which are similar to those during the period from t8 to t12 are repeated until the pulse of the set signal S is next supplied to the input terminal 43.

<4.2 Details of Operation>

Figure 9A:
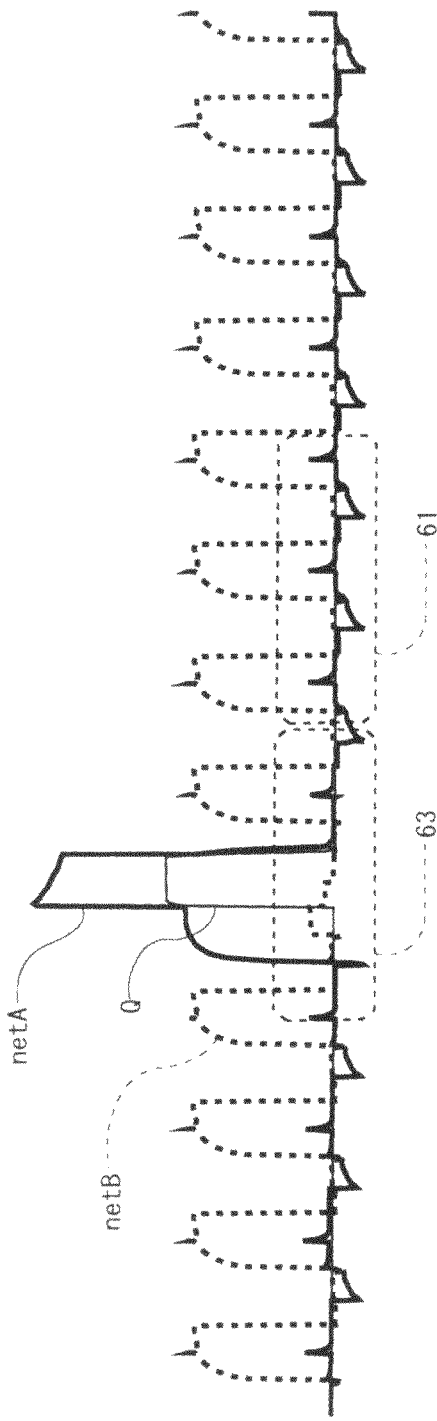
FIG. 9A is a waveform chart showing a result of simulation using the configuration according to the embodiment.
Figure 9B:
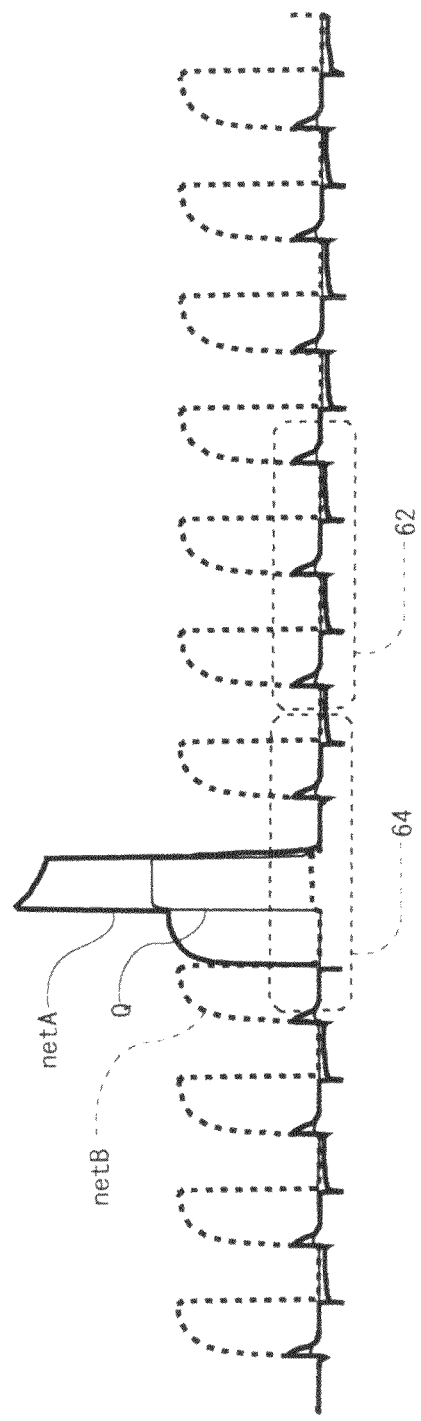
FIG. 9B is a waveform chart showing a result of simulation using a configuration according to a conventional example.
Figure 15:
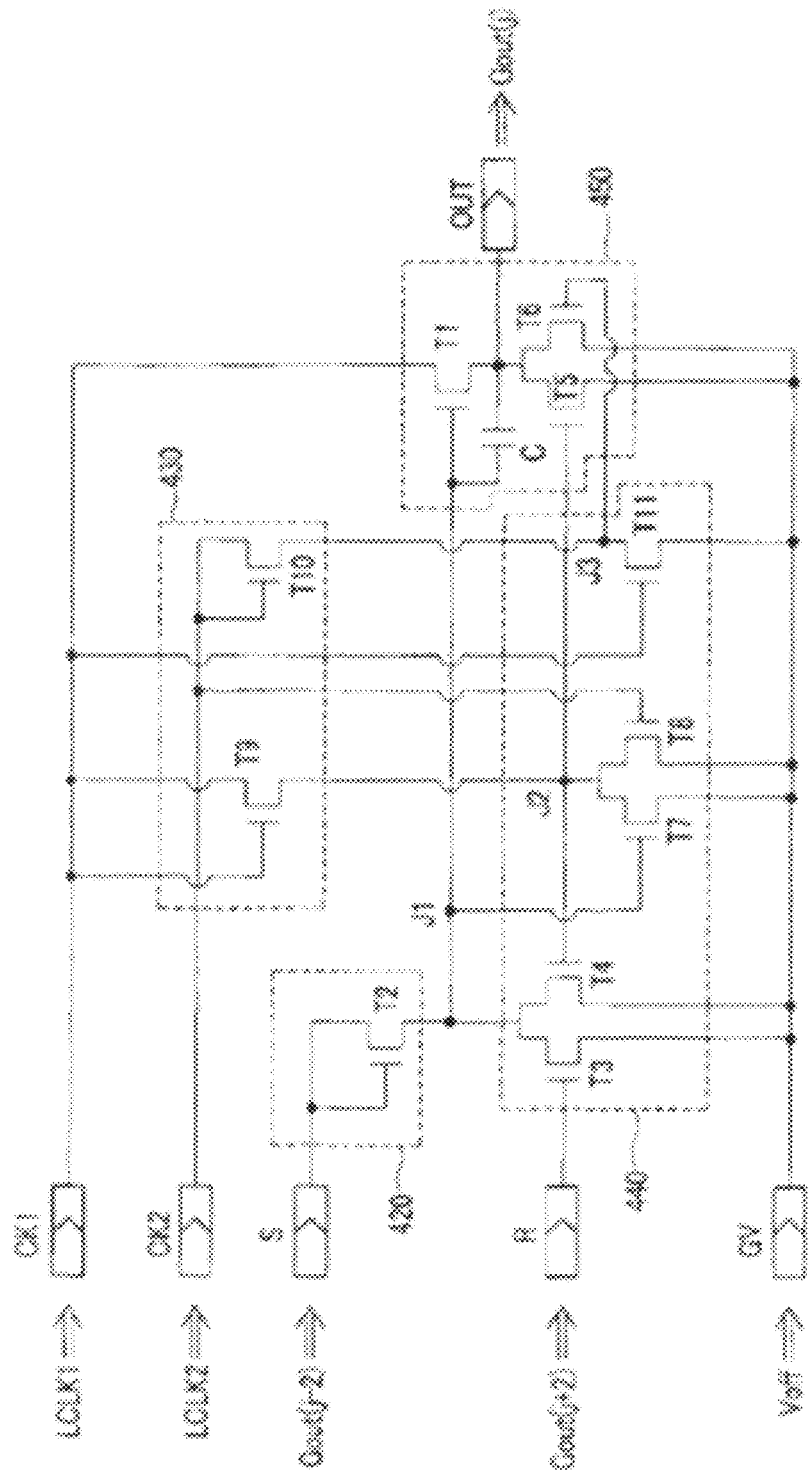
FIG. 15 is a circuit diagram showing a configuration example corresponding to one stage in a shift register included in a conventional gate driver.

The details of the operation of the bistable circuit in this embodiment will be described with reference to FIG. 1 and FIG. 9 to FIG. 11. Herein, FIG. 9A is a waveform chart showing a result of simulation using the configuration according to this embodiment, and FIG. 9B is a waveform chart showing a result of simulation using a configuration according to a conventional example (a configuration corresponding to the configuration shown in FIG. 15 from which T10 and T12 are removed). Moreover, FIG. 10 shows an enlarged diagram of a portion shown with a reference symbol 61 in FIG. 9A, an enlarged diagram of a portion shown with a reference symbol 62 in FIG. 9B, a waveform of the first clock CKA, a waveform of the second clock CKB, a waveform of the third clock CKC, and a waveform of the fourth clock CKD. Further, FIG. 11 shows an enlarged diagram of a portion shown with a reference symbol 63 in FIG. 9A, an enlarged diagram of a portion shown with a reference symbol 64 in FIG. 9B, a waveform of the first clock CKA, a waveform of the second clock CKB, a waveform of the third clock CKC, and a waveform of the fourth clock CKD. In FIG. 9 to FIG. 11, a bold solid line represents a change of the potential of netA, a bold dotted line represents a change of the potential of netB, and a slender solid line represents a change of the potential of the state signal Q.

<4.2.1 Operation in Non-Selection Period>

First, the operation in the non-selection period will be described with reference to FIG. 1 and FIG. 10. Herein, the period from t5 to t10 in FIG. 10 corresponds to the period from t5 to t10 in FIG. 7.

At the point in time t5, the fourth clock CKD changes from the High level to the Low level. As a result, the thin-film transistor T4 turns to the Off state. Moreover, the third clock CKC changes from the Low level to the High level. As a result, the thin-film transistor T3 turns to the On state. At the point in time t5, the thin-film transistor T6 is in the Off state as described above. Based on the above, the potential of netB rises at a timing which is slightly later than (is delayed from) the timing at which the third clock CKC changes from the Low level to the High level, and the thin-film transistor T2 turns to the On state as the potential of netB rises.

At the point in time t6, the first clock CKA changes from the Low level to the High level. At this time, the potential of netA rises as shown with a reference symbol 611 in FIG. 10 due to the above-described parasitic capacitance Cgs between the gate and source of the thin-film transistor T1. However, as described above, the thin-film transistor T2 is in the On state during the period from t5 to t7. Hence, the potential of netA falls rapidly to a potential which is equal to the potential of Vss, as shown with a reference symbol 612 in FIG. 10. Herein, attention is focused on the result of simulation using the configuration according to the conventional example. The potential of netA rises as shown with a reference symbol 621 in FIG. 10, and then falls gradually to the potential which is equal to the potential of Vss as shown with a reference symbol 622 in FIG. 10. As described above, after the potential of netA rises due to the change of the first clock CKA from the Low level to the High level, the potential of netA falls gently in the case of the configuration according to the conventional example, but the potential of netA falls rapidly in the case of the configuration according to this embodiment. The reason therefor is as follows. That is, in the conventional example, the clock signal that contributes to the rise of the potential of netA and the clock signal that contributes to the fall of the potential of netA change at the simultaneous timing. On the other hand, in this embodiment, the timing of the change of the clock signal that contributes to the fall of the potential of netA (specifically, the third clock CKC for setting the thin-film transistor T2 to the On state) is made earlier than the timing of the change of the clock signal that contributes to the rise of the potential of netA (specifically, the first clock CKA).

At the point in time t7, the third clock CKC changes from the High level to the Low level, and the fourth clock CKD changes from the Low level to the High level. Accordingly, the potential of netB falls. Then, the potential of netA falls to a potential which is slightly lower than the potential of Vss, as shown with a reference symbol 613 in FIG. 10, due to the parasitic capacitance between the gate and source of the thin-film transistor T2.

At the point in time t8, the first clock CKA changes from the High level to the Low level. At this time, the potential of netA falls largely as shown with a reference symbol 614 in FIG. 10, due to the parasitic capacitance Cgs between the gate and source of the thin-film transistor T1. Herein, as described above, the potential of netB is maintained at the Low level during the period from t7 to t9. Hence, there is no possibility that the potential of netA rises rapidly to the potential of Vss, since the thin-film transistor T2 is in the Off state (netA is in a floating state). In other words, the potential of netA rises gradually during the period from t8 to t9, as shown with a reference symbol 615 in FIG. 10. Herein, attention is focused on the result of simulation using the configuration according to the conventional example. The potential of netA falls largely as shown with a reference symbol 624 in FIG. 10, and then rises rapidly as shown with a reference symbol 625 in FIG. 10. As described above, after the potential of netA falls to the potential which is lower than the potential of Vss due to the change of the first clock CKA from the High level to the Low level, the potential of netA rises rapidly in the case of the configuration according to the conventional example, but the potential of netA rises gradually in the case of the configuration according to this embodiment. The reason therefor is as follows. That is, in the conventional example, there is required a somewhat period until the potential of netA falls to the potential which is lower than the potential of Vss and then the potential of netB falls satisfactorily to the potential at the Low level. During this period, the thin-film transistor for setting the potential of netA to the potential which is equal to the potential of Vss is in the On state. On the other hand, in this embodiment, at the point in time that the potential of netA falls to the potential which is lower than the potential of Vss, the thin-film transistor T2 for setting the potential of netA to the potential which is equal to the potential of Vss is already in the Off state.

At the point in time t9, the fourth clock CKD changes from the High level to the Low level and the third clock CKC changes from the Low level to the High level, so that the potential of netB rises. As a result, since the thin-film transistor T2 turns to the On state, the potential of netA rises to the potential which is equal to the potential of Vss, as shown with a reference symbol 616 in FIG. 10.

<4.2.2 Operations in Selection Period and Periods Previous and Subsequent to Selection Period>

Next, the operation in the selection period will be described with reference to FIG. 1 and FIG. 11. Herein, the period from t0 to t4 in FIG. 11 corresponds to the period from t0 to t4 in FIG. 7.

At the point in time t0, the pulse of the set signal S is supplied to the input terminal 43. As a result, netA is precharged, and the thin-film transistor T6 turns to the On state. Moreover, since the third clock CKC is in the Low level during the period from t0 to t1, the thin-film transistor T3 is maintained at the Off state during this period. Based on the above, during the period from t0 to t1, the potential of netB is maintained at the potential which is equal to the potential of Vss.

At the point in time t1, the fourth clock CKD changes from the High level to the Low level, and the third clock CKC changes from the Low level to the High level. As a result, the thin-film transistor T4 turns to the Off state, and the thin-film transistor T3 turns to the On state. Herein, since netA is precharged, the thin-film transistor T6 is in the On state. Based on the above, the potential of netB rises slightly as shown with a reference symbol 631 in FIG. 11.

At the point in time t2, the first clock CKA changes from the Low level to the High level, and the potential of netA rises as described above. As a result, the On resistance of the thin-film transistor T6 decreases, and the potential of netB falls to a potential shown with a reference symbol 632 in FIG. 11.

At the point in time t3, the third clock CKC changes from the High level to the Low level, and the fourth clock CKD changes from the Low level to the High level. As a result, the thin-film transistor T3 turns to the Off state, and the thin-film transistor T4 turns to the On state. Consequently, the potential of netB falls to the potential which is equal to the potential of Vss, as shown with a reference symbol 633 in FIG. 11. Herein, attention is focused on the result of simulation using the configuration according to the conventional example. During the period from t2 to t4, the potential of netB is maintained at a potential which is slightly higher than the potential of Vss, as shown with a reference symbol 642 in FIG. 11. As described above, when attention is focused on the period from t2 to t4, the potential of netB is maintained at the potential which is slightly higher than the potential of Vss in the case of the configuration according to the conventional example. On the other hand, the potential of netB is set to the potential which is slightly higher than the potential of Vss during the period from t2 to t3 and is set to the potential which is equal to the potential of Vss during the period from t3 to t4 in the case of the configuration according to this embodiment.

<5. Effects>

As described above, according to this embodiment, netB is controlled using the third clock CKC and fourth clock CKD which are shifted in phase by 90 degrees with respect to the first clock CKA that contributes to the variation of the potential of netA. Specifically, the potential of netB is raised based on the third clock CKC which is advanced in phase by 90 degrees with respect to the first clock CKA, and the potential of netB is set to the potential which is equal to the potential of Vss based on the fourth clock CKD which is delayed in phase by 90 degrees with respect to the first clock CKA. Hence, the thin-film transistor T2 for setting the potential of netA to the Low level turns to the On state at the timing which is earlier than the timing at which the first clock CKA changes from the Low level to the High level. As a result, when the potential of netA rises due to the change of the first clock CKA from the Low level to the High level in the non-selection period, the potential of netA falls rapidly to the potential which is equal to the potential of Vss. Consequently, a leakage current in the thin-film transistor T1 having the drain terminal connected to the output terminal 49 becomes smaller than that in the conventional case. Therefore, it is inhibited that an unnecessary electric current flows through the gate bus line. As a result, it is inhibited that unnecessary power consumption occurs due to a leakage current in a thin-film transistor. Moreover, even in the case of adopting, as a driving element, a thin-film transistor which is relatively large in off leakage, such as a thin-film transistor using microcrystalline silicon (a μc-Si TFT), a leakage current in the thin-film transistor is decreased as compared with that in the conventional case. Hence, it is possible to inhibit unnecessary power consumption while taking advantage of a μc-Si TFT.

Moreover, when the first clock CKA changes from the High level to the Low level in the non-selection period, the potential of netA falls to the potential which is lower than the potential of Vss. At this time, according to the conventional example, the potential of netA rises rapidly to the potential of Vss. On the other hand, according to this embodiment, the potential of netA rises gradually to the potential of Vss. Herein, with regard to an a-Si TFT or a μc-Si TFT, when a positive bias voltage is applied to a gate terminal, a threshold voltage rises (an electric current flows hardly). Moreover, when a negative bias voltage is applied to the gate terminal, the threshold voltage falls (an electric current flows readily). According to this embodiment, a negative bias voltage is applied to the gate terminal of the thin-film transistor T1 for a period of time which is longer than that in the conventional case. As a result, in addition to the positive bias voltage, the negative bias voltage is also applied satisfactorily to the gate terminal of the thin-film transistor T1 during the period that the display device works. Consequently, the threshold shift in the thin-film transistor T1 becomes smaller than that in the conventional case. Hence, it is possible to reduce the size of the thin-film transistor T1 as compared with that in the conventional case, which leads to size reduction in the display device.

Further, in this embodiment, the period that the potential of netB is set to the potential which is slightly higher than the potential of Vss in the selection period is reduced to almost one-half as compared with that in the conventional case. Here, when the potential of netB turns to the potential which is slightly higher than the potential of Vss, the thin-film transistor T2 approaches the On state, so that the potential of netA falls slightly. When the potential of netA falls in the selection period, the gate voltage of the thin-film transistor T1 falls. Therefore, the fall of the scanning signal becomes slow at the time of transition from the selection period to the non-selection period (a period to be required for the change from a gate-on voltage to a gate-off voltage becomes long). With regard to this point, according to this embodiment, since it is inhibited that the potential of netA falls in the selection period, the scanning signal falls rapidly at the time of transition from the selection period to the non-selection period. Hence, it is inhibited that display defect occurs because the fall of the scanning signal becomes slow.

Furthermore, according to this embodiment, in the shift registers 410 and 420, a relatively thick signal line is used as the signal line transmitting a clock signal contributing directly to the rise of a potential of a scanning signal (the first gate clock signal GCK1 and second gate clock signal GCK2 in the shift register 410, and the third gate clock signal GCK3 and fourth gate clock signal GCK4 in the shift register 420), and a relatively thin signal line is used as the signal line transmitting a clock signal for controlling the operation of the thin-film transistor included in each bistable circuit (the third gate clock signal GCK3 and fourth gate clock signal GCK4 in the shift register 410, and the first gate clock signal GCK1 and second gate clock signal GCK2 in the shift register 420). Hence, an increase in the circuit area of the scanning signal line drive circuit is prevented, while the operations of the shift registers 410 and 420 are kept at normal conditions.

<6. Modifications>

<6.1 Modification of Configuration of Bistable Circuit>

In the above embodiment, the diode-connected thin-film transistor T3 is provided between netB and the input terminal 47 for receiving the third clock CKC. However, a capacitor may be provided in place of the thin-film transistor T3. Moreover, a configuration including the constituent elements shown in FIG. 1 except the thin-film transistor T10 may be adopted.

<6.2 Modification of Configuration of Gate Driver>

Figure 12:
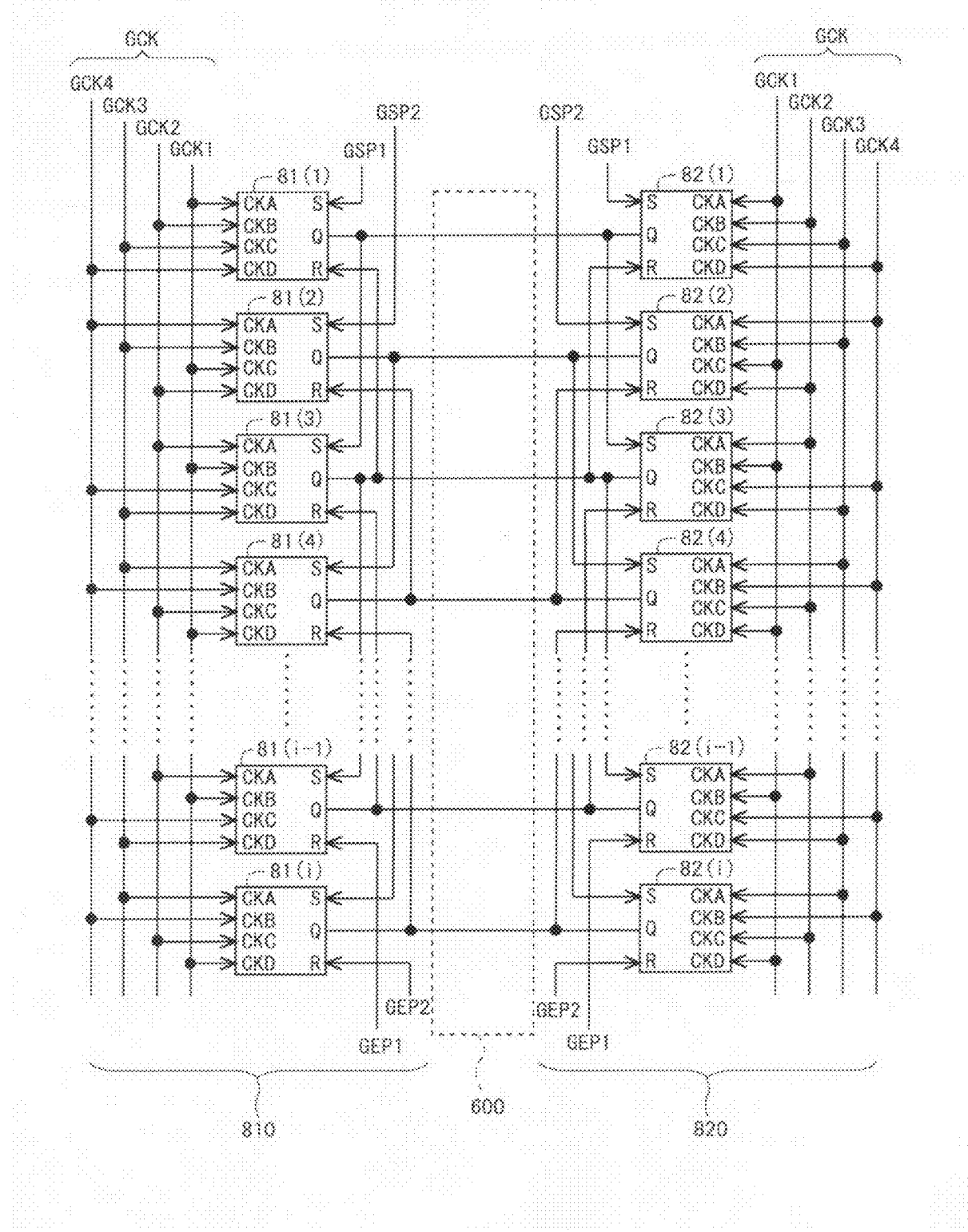
FIG. 12 is a block diagram showing a configuration of a shift register in a gate driver, in a modification of the embodiment.

In the above embodiment, the odd-numbered gate bus lines are driven by the first gate driver 401, and the even-numbered gate bus lines are driven by the second gate driver 402; however, the present invention is not limited to this. All the gate bus lines may be driven by the first and second gate drivers 401 and 402. FIG. 12 is a block diagram showing configurations of shift registers 810 and 820 in the first and second gate drivers 401 and 402 on the assumption that all the gate bus lines are driven by the first and second gate drivers 401 and 402. As shown in FIG. 12, the shift register 810 is configured with "i" bistable circuits 81(1) to 81(*i*), and the shift register 820 is configured with "i" bistable circuits 82(1) to 82(*i*). As in the above embodiment, each bistable circuit is provided with input terminals for receiving a first clock CKA, a second clock CKB, a third clock CKC and a fourth clock CKD, an input terminal for receiving a set signal S, an input terminal for receiving a reset signal R, and an output terminal for outputting a state signal Q.

The shift register 810 in the first gate driver 401 is supplied with, from the display control circuit 200, a first gate clock signal GCK1, a second gate clock signal GCK2, a third gate clock signal GCK3 and a fourth gate clock signal GCK4 as gate clock signals GCK, first and second gate start pulse signals GSP1 and GSP2, and first and second gate end pulse signals GEP1 and GSP2. The shift register 820 in the second gate driver 402 is supplied with signals which are similar to the signals supplied to the shift register 810 in the first gate driver 401.

In this modification, the signals to be supplied to the input terminals of each stage (each bistable circuit) in the shift register 810 are as follows. In the first stage 81(1), the first gate clock signal GCK1 is supplied as the first clock CKA, the second gate clock signal GCK2 is supplied as the second clock CKB, the third gate clock signal GCK3 is supplied as the third clock CKC, and the fourth gate clock signal GCK4 is supplied as the fourth clock CKD. In the second stage 81(2), the fourth gate clock signal GCK4 is supplied as the first clock CKA, the third gate clock signal GCK3 is supplied as the second clock CKB, the first gate clock signal GCK1 is supplied as the third clock CKC, and the second gate clock signal GCK2 is supplied as the fourth clock CKD. In the third stage 81(3), the second gate clock signal GCK2 is supplied as the first clock CKA, the first gate clock signal GCK1 is supplied as the second clock CKB, the fourth gate clock signal GCK4 is supplied as the third clock CKC, and the third gate clock signal GCK3 is supplied as the fourth clock CKD. In the fourth stage 81(4), the third gate clock signal GCK3 is supplied as the first clock CKA, the fourth gate clock signal GCK4 is supplied as the second clock CKB, the second gate clock signal GCK2 is supplied as the third clock CKC, and the first gate clock signal GCK1 is supplied as the fourth clock CKD. In the fifth stage and the stages subsequent thereto, configurations which are similar to the configurations from the first stage to the fourth stage are repeated every four stages. Moreover, in the first stage 81(1), the first gate start pulse signal GSP1 is supplied as the set signal S and, in the second stage 81(2), the second gate start pulse signal GSP2 is supplied as the set signal S. In the third stage 81(3) and the stages subsequent thereto, the state signal Q at the two previous stage is supplied as the set signal S. Further, in the first to "i–2"-th stages, the state signal Q at the previous stage is supplied as the reset signal R. In the "i–1"-th stage, the first gate end pulse signal GEP1 is supplied as the reset signal R and, in the "i"-th stage, the second gate end pulse signal GSP2 is supplied as the reset signal R. Herein, the signals to be supplied to the input terminals of each stage (each bistable circuit) in the shift register 820 are similar to those in the shift register 810; therefore, the description thereof will not be given.

With the foregoing configuration, the respective bistable circuits in the shift registers 810 and 820 are operated as in the bistable circuits in the above embodiment.

<6.3 Configuration Using Multi-Channel TFT>

Figure 13A:
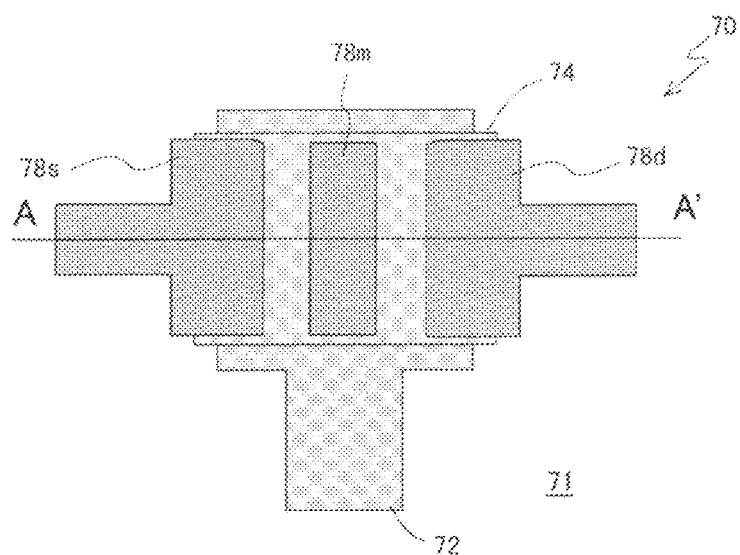
FIGS. 13A to 13C are diagrams for explaining a multi-channel TFT.
Figure 13B:
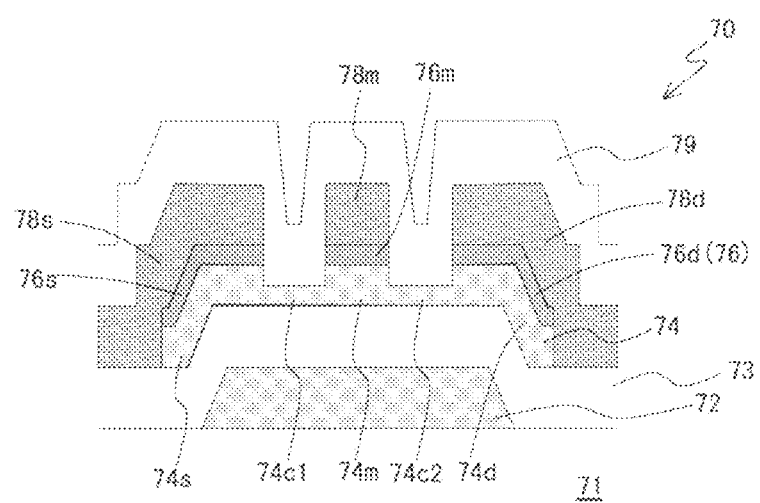

According to the above-described embodiments, when the potential of the netA increases during the period of t2 to t4 (see FIG. 7), a high voltage is applied between the source and the drain of the thin film transistors T2 and T7 (see FIG. 1). Therefore, these thin film transistors T2 and T7 can be configured by a multichannel TFT so that any leak current does not occur in the thin film transistors T2 and T7 due to the high voltage. The following describes the multichannel TFT with reference to FIG. 13. Note that, FIG. 13A is a plan view of the multichannel TFT, FIG. 13B is a cross-sectional view taken along line A-A' in FIG. 13A, and FIG. 13C is an equivalent circuit diagram of the multichannel TFT.

Figure 13C:
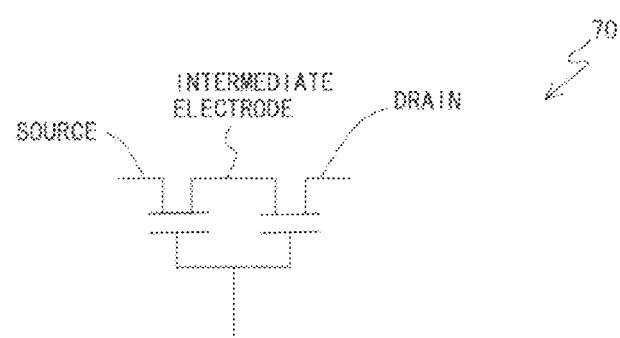

A multichannel TFT 70 has a dual-gate structure (double-gate structure), and has a structure electrically equivalent to two TFTs that are connected in series as shown in FIG. 13C. The multichannel TFT 70 is provided with an active layer 74 supported by a substrate (e.g., glass substrate) 71. The active layer 74 is a semiconductor layer, and includes a microcrystalline silicon (μc-Si) film. The active layer 74 is provided with channel regions 74c1 and 74c2, a source region 74s, a drain region 74d, and an intermediate region 74m sandwiched between the two channel regions 74c1 and 74c2. The multichannel TFT 70 is further provided with a contact layer 76 including a source contact region 76s that is in contact with the source region 74s, a drain contact region 76d that is in contact with the drain region 74d, and an intermediate contact region 76m that is in contact with the intermediate region 74m, a source electrode 78s that is in contact with the source contact region 76s, a drain electrode 78d that is in contact with the drain contact region 76d, an intermediate electrode 78m that is in contact with the intermediate contact region 76m, and a gate electrode 72 that is disposed opposing to the two channel regions 74c1 and 74c2 and the intermediate region 74m with a gate insulating film 73 interposed therebetween. In addition, the multichannel TFT 70 is further provided with a protecting film 79 that covers them. It should be noted that the intermediate electrode 78m is in a floating state.

The channel region 74c1 is formed between the source region 74s and the intermediate region 74m. The channel region 74c2 is formed between the drain region 74d and the intermediate region 74m. The two channel regions 74c1 and 74c2, the source region 74s, the drain region 74d, and the intermediate region 74m are formed in the single continuous active layer 74. Further, an entire portion of the intermediate electrode 78m corresponding to a portion between the channel region 74c1 and the channel region 74c2 overlaps the gate electrode 72 with the intermediate region 74m and the gate insulating film 73 interposed therebetween.

It should be noted that the active layer 74 of the multichannel TFT 70 is formed by a microcrystalline silicon film or a laminated film including a microcrystalline silicon film and an amorphous silicon film, and can be manufactured using the fabrication process for the conventional a-Si TFTs. The microcrystalline silicon film can be formed using a silane gas diluted with a hydrogen gas as a material gas by a plasma CVD method that is similar to the manufacturing method of an amorphous silicon film.

Figure 14:
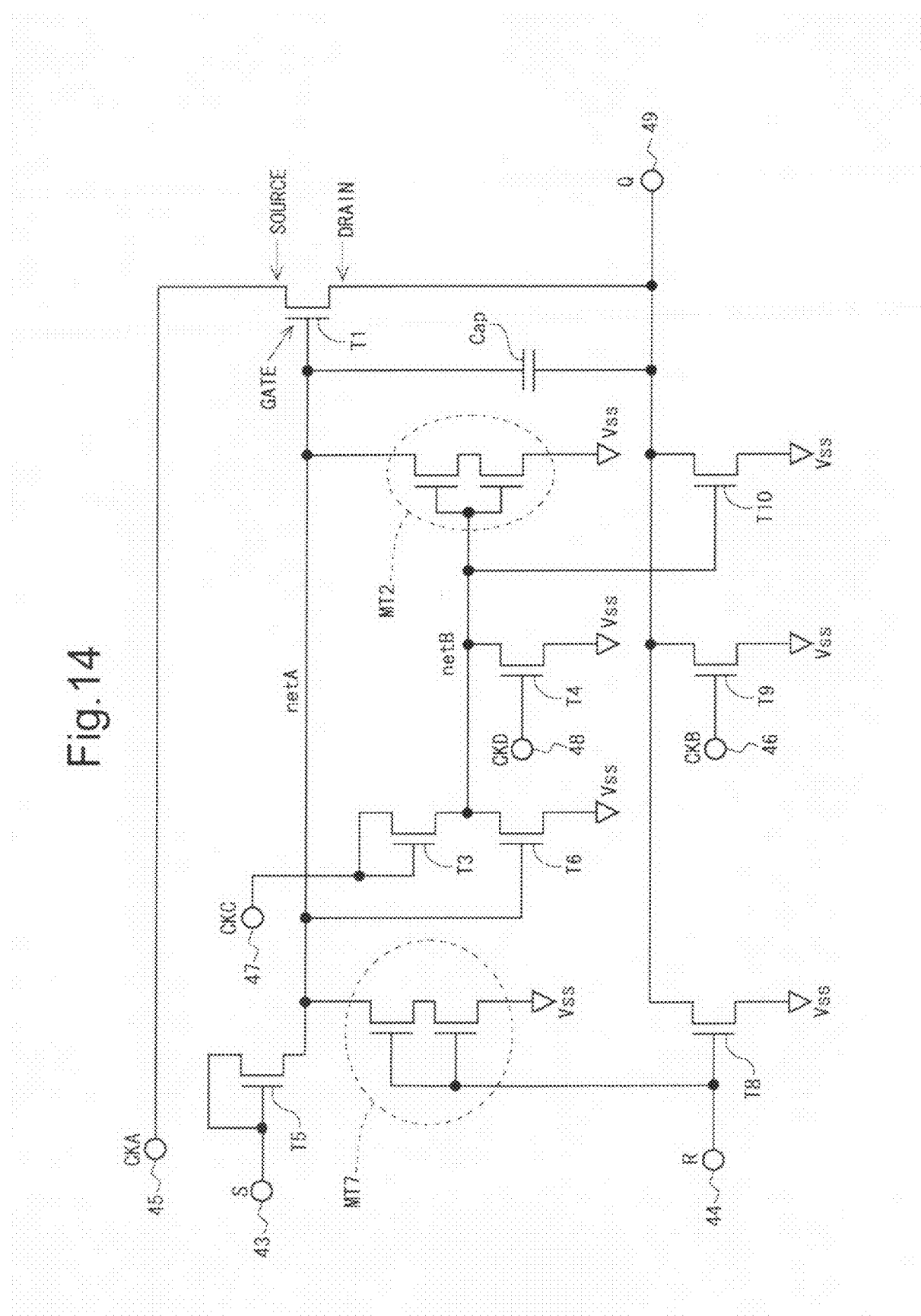
FIG. 14 is a circuit diagram of a configuration in which the bistable circuit according to the embodiment is formed using the multi-channel TFT.

As described above, configuring a thin film transistor whose drain electrode or source electrode is connected to the netA by the multichannel TFT (MT2, MT7) as, for example, shown in FIG. 14 can prevent the potential of the netA from decreasing due to a leak current in the thin film transistor caused by a high voltage between the source and the drain, even when the potential of the netA increases by bootstrapping. It should be noted that the thin film transistor T5 can be also configured by a multichannel TFT.

<7. Others>

While the above embodiments are described taking the liquid crystal display device as an example, the present invention is not limited to this. The present invention can be applied to a display device of other types, such as an organic EL (Electro Luminescence) display.

DESCRIPTION OF THE REFERENCE SYMBOLS

41(1) to 41(i/2) . . . Bistable circuit (in first gate driver)
42(1) to 42(i/2) . . . Bistable circuit (in second gate driver)
43 to 48 . . . Input terminal (of bistable circuit)
49 . . . Output terminal (of bistable circuit)
70 . . . Multi-channel TFT
200 . . . Display control circuit
300 . . . Source driver (video signal line drive circuit)
401 . . . First gate driver (first scanning signal line drive circuit)
402 . . . Second gate driver (second scanning signal line drive circuit)
410, 420, 810, 820 . . . Shift register
600 . . . Display portion
Cap . . . Capacitor
GL1 to GLi . . . Gate bus line
SL1 to SLj . . . Source bus line
T1 to T10 . . . Thin-film transistor
GEP1 . . . First gate end pulse signal
GEP2 . . . Second gate end pulse signal
GSP1 . . . First gate start pulse signal
GSP2 . . . Second gate start pulse signal
GCK . . . Gate clock signal
CKA, CKB, CKC, CKD . . . First clock, second clock, third clock, fourth clock
S . . . Set signal
R . . . Reset signal
Q . . . State signal

The invention claimed is:

1. A scanning signal line drive circuit of a display device that drives a plurality of scanning signal lines arranged on a display portion, the scanning signal line drive circuit comprising:
a shift register including a plurality of bistable circuits each having a first state and a second state and connected in series to one another, the shift register setting the plurality of bistable circuits sequentially to the first state based on four-phase clock signals which are externally inputted and are supplied as a first clock signal, a second clock signal, a third clock signal and a fourth clock signals to the respective bistable circuits, the four-phase clock signals each repeating a potential at a High level and a potential at a Low level cyclically, wherein
each bistable circuit includes:
an output-node charging portion including a first switching element having a first electrode supplied with the first clock signal, and a second electrode connected to an output-node which is a node for outputting a state signal indicating one of the first state and the second state and which is a node connected to the scanning signal line, the output-node portion setting the state indicated by the state signal to the first state;
an output-node discharging portion for setting the state indicated by the state signal to the second state;
a first-node charging a first-node connected to a third electrode of the first switching element based on a predetermined set signal;
a first first-node discharging portion for discharging the first-node, the first first-node discharging portion including a second switching element having a first electrode connected to the first-node, and a second electrode supplied with a predetermined low potential;
a second-node charging portion for charging a second-node connected to a third electrode of the second switching element based on the third clock signal; and
a first second-node discharging portion for discharging the second-node based on the fourth clock signal,
a duty ratio which is a ratio of a period, during which the potential at the High level is maintained, to a cycle, in which the potential at the High level and the potential at the Low level are repeated with regard to each of the four-phase clock signals, is set to one-half,
the first clock signal and the second clock signal are shifted in phase by 180 degrees with respect to each other,
the third clock signal and the fourth clock signal are shifted in phase by 180 degrees with respect to each other,
the third clock signal is advanced in phase with respect to the first clock signal, and
in each bistable circuit,
the second-node charging portion includes a third switching element having a first electrode and a second electrode each supplied with the third clock signal, and a third electrode connected to the second-node,
the first second-node discharging portion includes a fourth switching element having a first electrode supplied with the fourth clock signal, a second electrode connected to the second-node, and a third electrode supplied with a predetermined low potential, and
the first-node charging portion includes a fifth switching element having a first electrode and a third electrode each supplied with the set signal, and a second electrode connected to the first-node.

2. The scanning signal line drive circuit according to claim 1, wherein
each bistable circuit further includes a capacitor having one end connected to the first-node, and the other end connected to the output-node.

3. The scanning signal line drive circuit according to claim 1, wherein
the third clock signal is advanced in phase by 90 degrees with respect to the first clock signal.

4. The scanning signal line drive circuit according to claim 1, including
a first scanning signal line drive circuit for supplying the state signal from one ends to another ends of the plurality of scanning signal lines, and
a second scanning signal line drive circuit for supplying the state signal from the other ends to the one ends of the plurality of scanning signal lines.

5. The scanning signal line drive circuit according to claim 4, wherein
the first scanning signal line drive circuit supplies the state signal to one of the plurality of scanning signal lines on odd-numbered rows and the plurality of scanning signal lines on even-numbered rows, and
the second scanning signal line drive circuit supplies the state signal to the other one of the plurality of scanning signal lines on the odd-numbered rows and the plurality of scanning signal lines on the even-numbered rows.

6. The scanning signal line drive circuit according to claim 4, wherein
each scanning signal line is supplied with the state signal from both the first scanning signal line drive circuit and the second scanning signal line drive circuit.

7. The scanning signal line drive circuit according to claim 1, wherein
the switching elements included in each bistable circuit are thin-film transistors made of microcrystalline silicon.

8. The scanning signal line drive circuit according to claim 1, wherein
the switching elements included in each bistable circuit are thin-film transistors made of amorphous silicon.

9. The scanning signal line drive circuit according to claim 1, wherein
at least one of the switching elements each having the first electrode connected to the first-node is a thin-film transistor having a multi-channel structure.

10. A scanning signal line drive circuit of a display device that drives a plurality of scanning signal lines arranged on a display portion, the scanning signal line drive circuit comprising:
a shift register including a plurality of bistable circuits each having a first state and a second state and connected in series to one another, the shift register setting the plurality of bistable circuits sequentially to the first state based on four-phase clock signals which are externally inputted and are supplied as a first clock signal, a second clock signal, a third clock signal and a fourth clock signals to the respective bistable circuits, the four-phase clock signals each repeating a potential at a High level and a potential at a Low level cyclically, wherein
each bistable circuit includes:
an output-node charging portion including a first switching element having a first electrode supplied with the first clock signal, and a second electrode connected to an output-node which is a node for outputting a state signal indicating one of the first state and the second state and which is a node connected to the scanning signal line, the output-node portion setting the state indicated by the state signal to the first state;
an output-node discharging portion for setting the state indicated by the state signal to the second state;
a first-node charging portion for charging a first-node connected to a third electrode of the first switching element based on a predetermined set signal;
a first first-node discharging portion for discharging the first-node, the first first-node discharging portion including a second switching element having a first electrode connected to the first-node, and a second electrode supplied with a predetermined low potential;
a second-node charging portion for charging a second-node connected to a third electrode of the second switching element based on the third clock signal;
a first second-node discharging portion for discharging the second-node based on the fourth clock signal;
a second second-node discharging portion for discharging the second-node based on a charging voltage of the first-node, the second second-node discharging portion including a third switching element having a first electrode connected to the first-node, a second electrode connected to the second-node, and a third electrode supplied with the predetermined low potential; and
a second first-node discharging portion for discharging the first-node based on a predetermined reset signal, the second first-node discharging portion including a fourth switching element having a first electrode supplied with the reset signal, a second electrode connected to the first-node, and a third electrode supplied with a predetermined low potential,
a duty ratio which is a ratio of a period, during which the potential at the High level is maintained, to a cycle, in which the potential at the High level and the potential at the Low level are repeated with regard to each of the four-phase clock signals, is set to one-half,
the first clock signal and the second clock signal are shifted in phase by 180 degrees with respect to each other,
the third clock signal and the fourth clock signal are shifted in phase by 180 degrees with respect to each other, and
the third clock signal is advanced in phase with respect to the first clock.

11. The scanning signal line drive circuit according to claim 10, wherein
the four-phase clock signals are configured with a first clock signal group including two-phase clock signals which are supplied as the first and second clock signals to each bistable circuit, and a second clock signal group including two-phase clock signals which are supplied as the third and fourth clock signals to each bistable circuit, and
when adjacent two bistable circuits are defined as first and second bistable circuits,
the first bistable circuit is supplied with, as the first clock signal, one of the two-phase clock signals included in the first clock signal group, is supplied with, as the second clock signal, the other one of the two-phase clock signals included in the first clock signal group, is supplied with, as the third clock signal, one of the two-phase clock signals included in the second clock signal group, is supplied with, as the fourth clock signal, the other one of the two-phase clock signals included in the second clock signal group, and is supplied with, as the reset signal, the state signal outputted from the second bistable circuit, and
the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

12. The scanning signal line drive circuit according to claim 11, wherein
the signal line transmitting the first clock signal group is larger in width than the signal line transmitting the second clock signal group.

13. The scanning signal line drive circuit according to claim 10, wherein
the four-phase clock signals are configured with a first clock signal set and a second clock signal set each including the two-phase clock signals shifted in phase by 180 degrees with respect to each other, and
when a bistable circuit previous to a certain one of the plurality of bistable circuits is defined as a first bistable circuit and a bistable circuit subsequent to the certain bistable circuit is defined as a second bistable circuit,
the first bistable circuit is supplied with, as the first clock signal, one of the two-phase clock signals included in the first clock signal set, is supplied with, as the second clock signal, the other one of the two-phase clock signals included in the first clock signal set, is supplied with, as the third clock signal, one of the two-phase clock signals included in the second clock signal set, is supplied with, as the fourth clock signal, the other one of the two-phase clock signals included in the second clock signal set, and is supplied with, as the reset signal, the state signal outputted from the second bistable circuit, and the second bistable circuit is supplied with, as the first clock signal, the signal which is supplied as the second clock signal to the first bistable circuit, is supplied with, as the second clock signal, the signal which is supplied as the first clock signal to the first bistable circuit, is supplied with, as the third clock signal, the signal which is supplied as the fourth clock signal to the first bistable circuit, is supplied with, as the fourth clock signal, the signal which is supplied as the third clock signal to the first bistable circuit, and is supplied with, as the set signal, the state signal outputted from the first bistable circuit.

14. A scanning signal line drive circuit of a display device that drives a plurality of scanning signal lines arranged on a display portion, the scanning signal line drive circuit comprising:

a shift register including a plurality of bistable circuits each having a first state and a second state and connected in series to one another the shift register setting the plurality of bistable circuits sequentially to the first state based on four-phase clock signals which are externally inputted and are supplied as a first clock signal, a second clock signal, a third clock signal and a fourth clock signals to the respective bistable circuits, the four-phase clock signals each repeating a potential at a High level and a potential at a Low level cyclically, wherein each bistable circuit includes:

an output-node charging portion including a first switching element having a first electrode supplied with the first clock signal, and a second electrode connected to an output-node which is a node for outputting a state signal indicating one of the first state and the second state and which is a node connected to the scanning signal line, the output-node charging portion setting the state indicated by the state signal to the first state;

an output-node discharging portion for setting the state indicated by the state signal to the second state;

a first-node charging portion for charging a first-node connected to a third electrode of the first switching element based on a predetermined set signal;

a first first-node discharging portion for discharging the first-node, the first first-node discharging portion including a second switching element having a first electrode connected to the first-node, and a second electrode supplied with a predetermined low potential;

a second-node charging portion for charging a second-node connected to a third electrode of the second switching element based on the third clock signal; and a first second-node discharging portion for discharging the second-node based on the fourth clock signal, the output-node discharging portion includes:

a first output-node discharging portion for setting the state indicated by the state signal to the second state based on the reset signal, the first output-node discharging portion including a third switching element having a first electrode supplied with the reset signal, a second electrode connected to the output-node, and a third electrode supplied with a predetermined low potential; and a second output-node discharging portion for setting the state indicated by the state signal to the second state based on the second clock signal, the second output-node discharging portion including a fourth switching element having a first electrode supplied with the second clock signal, a second electrode connected to the output-node, and a third electrode supplied with a predetermined low potential, a duty ratio which is a ratio of a period, during which the potential at the High level is maintained, to a cycle, in which the potential at the High level and the potential at the Low level are repeated with regard to each of the four-phase clock signals, is set to one-half, the first clock signal and the second clock signal are shifted in phase by 180 degrees with respect to each other, the third clock signal and the fourth clock signal are shifted in phase by 180 degrees with respect to each other, and the third clock signal is advanced in phase with respect to the first clock signal.

15. The scanning signal line drive circuit according to claim 14, wherein the output-node discharging portion further includes a third output-node discharging portion for setting the state indicated by the state signal to the second state based on a charging voltage of the second-node, the third output-node discharging portion including a fifth switching element having a first electrode connected to the second-node, a second electrode connected to the output-node, and a third electrode supplied with a predetermined low potential.

* * * * *